(12) United States Patent
Tamura et al.

(10) Patent No.: US 7,643,328 B2
(45) Date of Patent: Jan. 5, 2010

(54) METHOD OF WRITING INTO SEMICONDUCTOR MEMORY DEVICE

(75) Inventors: Tetsuro Tamura, Kawasaki (JP); Kentaro Kinoshita, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 109 days.

(21) Appl. No.: 12/104,018

(22) Filed: Apr. 16, 2008

(65) Prior Publication Data
US 2008/0192531 A1    Aug. 14, 2008

Related U.S. Application Data

(63) Continuation of application No. PCT/JP2005/019236, filed on Oct. 19, 2005.

(51) Int. Cl.
*G11C 11/00* (2006.01)
(52) U.S. Cl. ........................ 365/148; 365/163
(58) Field of Classification Search ............... 365/113, 365/163, 148, 158, 189.16
See application file for complete search history.

(56) References Cited

U.S. PATENT DOCUMENTS

| | | | |
|---|---|---|---|
| 6,473,332 B1 | 10/2002 | Ignatiev et al. | |
| 7,050,328 B2 * | 5/2006 | Khouri et al. | 365/163 |
| 7,106,618 B2 * | 9/2006 | Morimoto | 365/148 |
| 7,251,157 B2 * | 7/2007 | Osada et al. | 365/163 |
| 7,335,907 B2 * | 2/2008 | Terao et al. | 257/2 |
| 7,391,664 B2 * | 6/2008 | Parkinson et al. | 365/222 |
| 2003/0067013 A1 | 4/2003 | Ichihara et al. | |
| 2004/0057180 A1 * | 3/2004 | Pashmakov | 361/90 |
| 2004/0264244 A1 | 12/2004 | Morimoto | |
| 2009/0168495 A1 * | 7/2009 | Aoki | 365/148 |

FOREIGN PATENT DOCUMENTS

EP    1 486 985 A2    12/2004

(Continued)

OTHER PUBLICATIONS

I. G. Baek et al; "Highly Scalable Non-volatile Resistive Memory using Simple Binary Oxide Driven by Asymmetric Unipolar Voltage Pulses"; Tech. Digest IEDM 2004, pp. 587-590.

(Continued)

*Primary Examiner*—Gene N Auduong
(74) *Attorney, Agent, or Firm*—Westerman, Hattori, Daniels & Adrian, LLP

(57) ABSTRACT

An NMOS transistor 14 having one end connected to one end of a resistance memory element 10 is provided, and when a voltage is applied to the resistance memory element 10 via the NMOS transistor 14 to switch the resistance memory element 10 from the low resistance state to the high resistance state, the gate voltage of the NMOS transistor 14 is set at a value which is equal to or greater than the total of the reset voltage of the resistance memory element 10 and the threshold voltage of the NMOS transistor 14 and is smaller than the total of the set voltage of the resistance memory element 10 and the threshold voltage of the NMOS transistor 14, whereby the voltage applied to the resistance memory element 10 is set at a value which is equal to or greater than the reset voltage and is smaller than the set voltage.

20 Claims, 19 Drawing Sheets

FOREIGN PATENT DOCUMENTS

| | | |
|---|---|---|
| JP | 2004-110867 A | 4/2004 |
| JP | 2004-272975 A | 9/2004 |
| JP | 2004-355670 A | 12/2004 |
| JP | 2005-025914 A | 1/2005 |
| JP | 2005-216387 A | 8/2005 |

OTHER PUBLICATIONS

A. Beck et al; "Reproducible switching effect in thin oxide films for memory applications"; Appl. Phys. Lett., vol. 77, pp. 139-141.

W. W. Zhuang et al; Novell Colossal Magnetoresistive Thin Film Nonvolatile Resistance Random Access Memory (RRAM); Tech. Digest IEDM 2002, pp. 193-196.

International Search Report of PCT/JP2005/019236; date of mailing Feb. 28, 2006.

Korean Office Action dated Sep. 14, 2009, issued in corresponding Korean Patent Application No. 2008-7008057.

* cited by examiner

WORD LINE VOLTAGE

BIT LINE VOLTAGE

VOLTAGE APPLIED TO
RESISTANCE MEMORY
ELEMENT $V_0$

CURRENT FLOWING IN
RESISTANCE MEMORY
ELEMENT

WORD LINE VOLTAGE

BIT LINE VOLTAGE

VOLTAGE APPLIED TO RESISTANCE MEMORY ELEMENT $V_0$

CURRENT FLOWING IN RESISTANCE MEMORY ELEMENT

WORD LINE VOLTAGE

BIT LINE VOLTAGE

VOLTAGE APPLIED TO
RESISTANCE MEMORY
ELEMENT $V_0$

CURRENT FLOWING IN
RESISTANCE MEMORY
ELEMENT

WORD LINE VOLTAGE — $V_{set}+V_{th}$ vs TIME

BIT LINE VOLTAGE — $V_{cc}$ vs TIME

VOLTAGE APPLIED TO RESISTANCE MEMORY ELEMENT $V_0$ — $V_{set}$ vs TIME

CURRENT FLOWING IN RESISTANCE MEMORY ELEMENT vs TIME

WORD LINE VOLTAGE

BIT LINE VOLTAGE

VOLTAGE APPLIED TO
RESISTANCE MEMORY
ELEMENT $V_0$

CURRENT FLOWING IN
RESISTANCE MEMORY
ELEMENT

WORD LINE VOLTAGE

BIT LINE VOLTAGE

VOLTAGE APPLIED TO
RESISTANCE MEMORY
ELEMENT $V_0$

CURRENT FLOWING IN
RESISTANCE MEMORY
ELEMENT

METHOD OF WRITING INTO SEMICONDUCTOR MEMORY DEVICE

CROSS REFERENCE TO RELATED APPLICATIONS

This application is a Continuation of International Application No. PCT/JP2005/019236, with an international filing date of Oct. 19, 2005, which designating the United States of America, the entire contents of which are incorporated herein by reference.

TECHNICAL FIELD

The present invention relates to a method of writing into a semiconductor memory device, more specifically, a method of writing into a semiconductor memory device using a resistance memory element having a plurality of resistance states of different resistance values.

BACKGROUND

Recently, as a new memory device, a semiconductor memory device called Resistance Random Access Memory (RRAM) is noted. The RRAM uses a resistance memory element which has a plurality of resistance states of different resistance values which are changed by electric stimulations applied from the outside and whose high resistance state and low resistance state are corresponded to, e.g., information "0" and "1" to be used as a memory element. The RRAM is considered prospective because of the high potentials of the high speed, large capacities, low electric power consumption, etc.

The resistance memory element has a resistance memory material whose resistance states are changed by the application of voltages sandwiched between a pair of electrodes. As the typical resistance memory material, oxide materials containing transition metals are known.

The semiconductor memory device using the resistance memory element is disclosed in, e.g., U.S. Pat. No. 6,473,332, Japanese published unexamined patent application No. 2005-025914, Japanese published unexamined patent application No. 2004-272975, Japanese published unexamined patent application No. 2004-110867, Japanese published unexamined patent application No. 2004-355670, A. Beck et al., Appl. Phys. Lett., Vol. 77, p. 139 (2001), W. W. Zhuang et al., Tech. Digest IEDM 2002, p. 193, and I. G. Baek et al., Tech. Digest IEDM 2004, p. 587.

However, the conventional method of simply applying a voltage to the resistance memory element to thereby change the state of the resistance memory material from the low resistance state to the high resistance state applies an excessive voltage to the resistance memory element. There is a risk that such an excessive voltage might change the resistance state of the resistance memory element from the high resistance state again to the low resistance state, and the high resistance state could not be retained.

SUMMARY

According to one aspect of the present invention, there is provided a semiconductor memory device comprising: a resistance memory element which memorizes a high resistance state and a low resistance state and switches between the high resistance state and the low resistance by a voltage application; a transistor having one end connected to one end of the resistance memory element; and wherein when a voltage is applied to the resistance memory element via the transistor to switch the resistance memory element from the low resistance state to the high resistance state, a gate voltage of the transistor is set at a value which is equal to or greater than a total of a reset voltage necessary to reset the resistance memory element and a threshold voltage of the transistor and is smaller than a total of a set voltage necessary to set the resistance memory element and the threshold voltage, to thereby set the voltage applied to the resistance memory element at a value which is equal to or greater than the reset voltage and is smaller than the set voltage.

According to another aspect of the present invention, there is provided a method of writing into a semiconductor memory device comprising a resistance memory element which memorizes a high resistance state and a low resistance state and switches between the high resistance state and the low resistance state by a voltage application, the method comprising: providing a transistor having one end connected to one end of the resistance memory element; and when applying a voltage to the resistance memory element via the transistor to switch the resistance memory element from the low resistance state to the high resistance state, setting a gate voltage of the transistor at a value which is equal to or greater than a total of a reset voltage necessary to reset the resistance memory element and a threshold voltage of the transistor and is smaller than a total of a set voltage necessary to set the resistance memory element and the threshold voltage, to thereby set the voltage applied to the resistance memory element at a value which is equal to or greater than the reset voltage and is smaller than the set voltage.

According to further another aspect of the present invention, there is provided a semiconductor memory device comprising: a plurality of memory cells arranged in a matrix and each including a resistance memory element which memorizes a high resistance state and a low resistance state and switches between the high resistance state and the low resistance state by a voltage application, and a selective transistor having one end connected to one end of the resistance memory element; a plurality of first signal lines arranged in parallel with each other in a first direction and each connected to gate electrodes of the selective transistors of the memory cells arranged in the first direction; and a plurality of second signal lines arranged in parallel with each other in a second direction crossing the first direction and each connected to the other ends of the selective transistors of the memory cells arranged in the second direction, wherein a voltage which is equal to or greater than a total of a reset voltage necessary to reset the resistance memory element and a threshold voltage of the selective transistor and is smaller than a total of a set voltage necessary to set the resistance memory element and the threshold voltage is applied to the first signal line connected to a memory cell to be rewritten of said plurality of the memory cells, whose resistance memory element is to be rewritten from the low resistance state to the high resistance state, and a pulse voltage equal to or greater than the reset voltage is applied to the second signal line connected to the memory cell to be rewritten, with the voltage which is equal to or greater than the total of the reset voltage and the threshold voltage and is smaller than the total of the set voltage and the threshold voltage being applied to the first signal line connected to the memory cell to be rewritten, to thereby rewrite the resistance memory element of the memory cell to be rewritten from the low resistance state to the high resistance state.

According to further another aspect of the present invention, there is provided a semiconductor memory device comprising: a plurality of memory cells arranged in a matrix and each including a resistance memory element which memorizes a high resistance state and a low resistance state and switches between the high resistance state and the low resistance state by a voltage application, and a selective transistor having one end connected to one end of the resistance memory element; a plurality of first signal lines arranged in parallel with each other in a first direction and each connected to gate electrodes of the selective transistors of the memory cells arranged in the first direction; and a plurality of second signal lines arranged in parallel with each other in a second direction crossing the first direction and each connected to the other ends of the selective transistors of the memory cells arranged in the second direction, wherein a voltage equal to or greater than a reset voltage necessary to reset the resistance memory element is applied to the second signal line connected to a memory cell to be rewritten of said plurality of the memory cells, whose resistance memory element is to be rewritten from the low resistance state to the high resistance state, and a pulse voltage which is equal to or greater than a total of the reset voltage and a threshold voltage of the selective transistor and is smaller than a total of a set voltage necessary to set the resistance memory element and the threshold voltage is applied to the first signal line connected to the memory cell to be rewritten, with the voltage equal to or greater than the reset voltage being applied to the second signal line connected to the memory cell to be rewritten, to thereby rewrite the resistance memory element of the memory cell to be rewritten from the low resistance state to the high resistance state.

DETAILED DESCRIPTION OF THE INVENTION

A FIRST EMBODIMENT

First, the basic operation of the resistance memory element will be explained with reference to FIG. 1.

The resistance memory element includes a resistance memory material sandwiched between a pair of electrodes. Many of the resistance memory materials are oxide materials containing transition metals and can be classified roughly in two groups, depending on the electric characteristics difference.

One group includes materials which require voltages of the same polarity so as to change the resistance value between the high resistance state and the low resistance state, and oxides of single transition metals, such as $NiO_x$, $TiO_x$, and others fall into said one group. Such a resistance memory material which requires voltages of the same polarity to rewrite the resistance state is called a unipolar resistance memory material.

The other includes materials which require voltages of polarities different from each other so as to change the resistance state between the high resistance state and the low resistance state, and $SrTiO_3$ and $SrZrO_3$ doped with a trance of an impurity, such as chrome (Cr), etc. or $Pr_{1-x}Ca_xMnO_3$, $La_{1-x}Ca_xMnO_3$, etc., which exhibit CMR (Colossal Magneto-Resistance), fall into the other group. Such a resistance memory material which requires voltages of polarities different from each other to rewrite the resistance state is called a bipolar resistance memory material.

In the following explanation, the resistance memory element using the unipolar resistance memory material will be explained.

Figure 1:
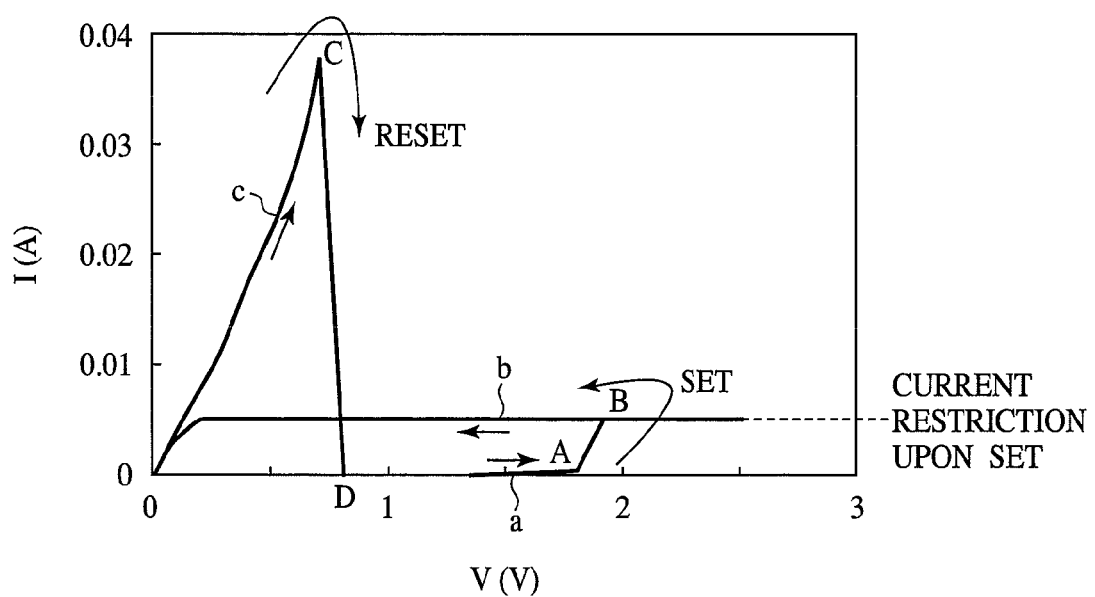
FIG. 1 is a graph showing the current-voltage characteristics of a resistance memory element using a unipolar resistance memory material.

FIG. 1 is a graph showing the current-voltage characteristics of the resistance memory element using the unipolar resistance memory material. This graph is of the case that $TiO_x$, which is a typical unipolar resistance memory material, is used.

In the initial state, the resistance memory element is assumed to be in the high resistance state.

As the applied voltage is increased gradually from 0 V, the current changes in the arrowed direction along the curve a, and its absolute value gradually increases. The applied voltage is further increased, and when the applied voltage has exceeded a prescribed value, the resistance memory element is switched from the high resistance state to the low resistance state. In the following explanation, the operation of changing the resistance memory element from the high resistance state to the low resistance state is called "set". Accompanying this, the absolute value of the current abruptly increases, and the current-voltage characteristics transit from the point A to the point B. In FIG. 1, the current value at the point B is constant, because the current restriction is made for the preventing of the breakage of the element by the abrupt current increase.

As the applied voltage is decreased gradually from the state at the point B, the current changes in the arrowed direction along the curve b, and its absolute value gradually decreases. When the applied voltage is returned to 0 V, the current also becomes 0 A.

Next, when the current restriction is released, and the applied voltage is increased gradually from 0 V, the current changes in the arrowed direction along the curve c, and its absolute value gradually increases. The applied voltage is further increased, and when the applied voltage has exceeded a prescribed value, the resistance memory element is switched from the low resistance state to the high resistance state. In the following explanation, the operation of changing the resistance memory element from the low resistance state to the high resistance state is called "reset". Accompanying this, the absolute value of the current abruptly decreases, and the current-voltage characteristics transit from the point C to the point D.

As the applied voltage is decreased gradually from the state at the point D, its absolute value gradually decreases. When the applied voltage is returned to 0 V, the current also becomes 0 V.

The respective resistance states are stable at a prescribed voltage value or below and are retained even when the power source is turned off. That is, in the high resistance state, the applied voltage is below the voltage at the point A, the current-voltage characteristics change linearly along the curve a, and the high resistance state is retained. Similarly, in the low resistance state, when the applied voltage is below the voltage at the point C, the current-voltage characteristics change along the curve c, and the low resistance state is retained.

As described above, to set or reset the resistance memory element, a voltage necessary respectively for the set and reset may be applied. In the actual operation, however, when a voltage is simply applied to reset the resistance memory element from the low resistance state to the high resistance state, an inconvenience arises as follows.

Figure 2A:
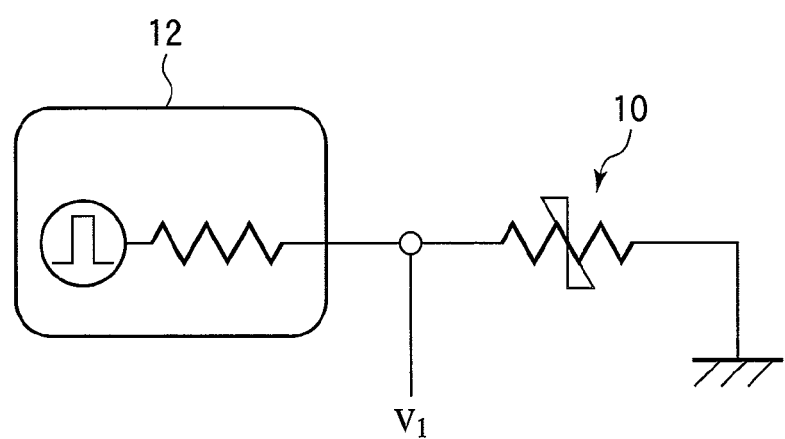
FIGS. 2A-2B and 3A-3B are views explaining the application of a voltage to a resistance memory element.
Figure 2B:
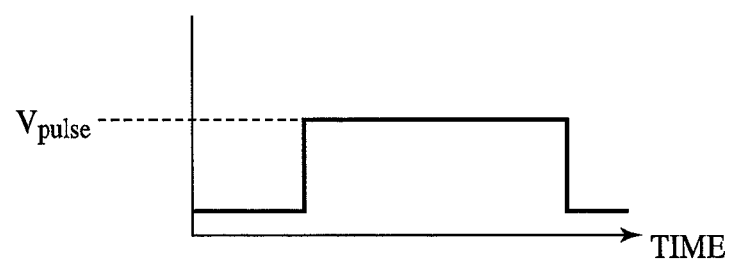

FIG. 2A is a circuit diagram showing the circuit constitution for applying a voltage to the resistance memory element. As shown, a resistance memory element 10 has one end connected to a pulse generator 12 for applying a pulse voltage and has the other end connected to a reference potential, e.g., 0 V, which is the ground potential. FIG. 2B shows a pulse voltage of a voltage value $V_{pulse}$ to be applied to the resistance memory element 10 by the pulse generator 12.

Figure 3A:
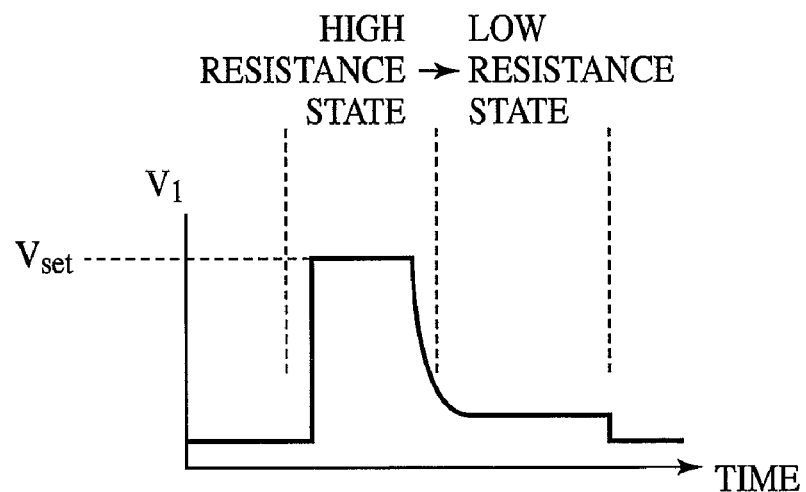
Figure 3B:
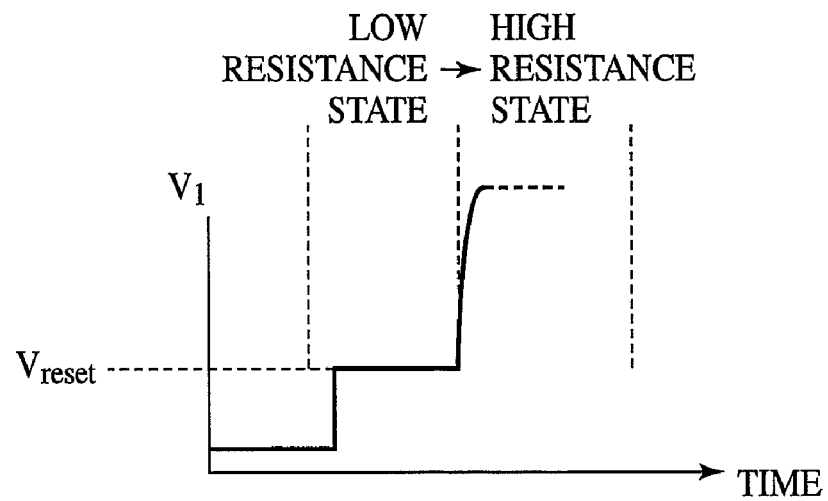

FIGS. 3A and 3B show time charts of a voltage $V_1$ applied to the resistance memory element 10 when the pulse voltage is applied to the resistance memory element 10 in the circuit constitution of FIG. 2. FIG. 3A shows the time variation of the voltage $V_1$ when the resistance memory element 10 is set from the high resistance state to the low resistance state. FIG. 3B shows the time variation of the voltage $V_1$ when the resistance memory element 10 is reset from the low resistance state to the high resistance state.

When the resistance memory element 10 is set, a pulse voltage of a voltage value (set voltage value $V_{set}$) necessary to set the resistance memory element 10 is applied to the resistance memory element 10 by the pulse generator 12. At the time when this pulse voltage is applied to the resistance memory element 10, a required voltage is applied to the resistance memory element 10. Thus, the resistance memory element 10 is changed from the high resistance state to the low resistance state (FIG. 3A). When the resistance memory element 10 is changed to the low resistance state, most of the applied voltage is applied to the interior resistor of the pulse generator 12 or the resistor of the interconnection between the pulse generator 12 and the resistance memory element 10. Resultantly, the voltage applied to the resistance memory element 10 is lowered.

On the other hand, when the resistance memory element 10 is reset, a pulse voltage of a voltage value (reset voltage $V_{reset}$) necessary to reset the resistance memory element 10 is applied to the resistance memory element 10. At the time when this pulse voltage is applied to the resistance memory element 10, a required voltage is applied to the resistance memory element 10. Thus, the resistance memory element 10 is changed from the low resistance state to the high resistance state (FIG. 3B). However, in resetting the resistance memory element 10, instantaneously with the resistance memory element 10 having changed to the high resistance state, almost all of the applied voltage is applied to the resistance memory element 10. Accordingly, the voltage applied to the resistance memory element 10 exceeds the set voltage, and there is a risk that the resistance memory element 10 might be changed from the high resistance state to the low resistance state, and the high resistance state could not be retained.

The resetting method of the resistance memory element according to the present embodiment makes it possible to prevent the application of an excessive voltage to the resistance memory element when the resistance memory element is switched from the low resistance state to the high resistance state, and resultantly the resistance memory element is prevented from changing again to the low resistance state due to the application of the excessive voltage.

Figure 4:
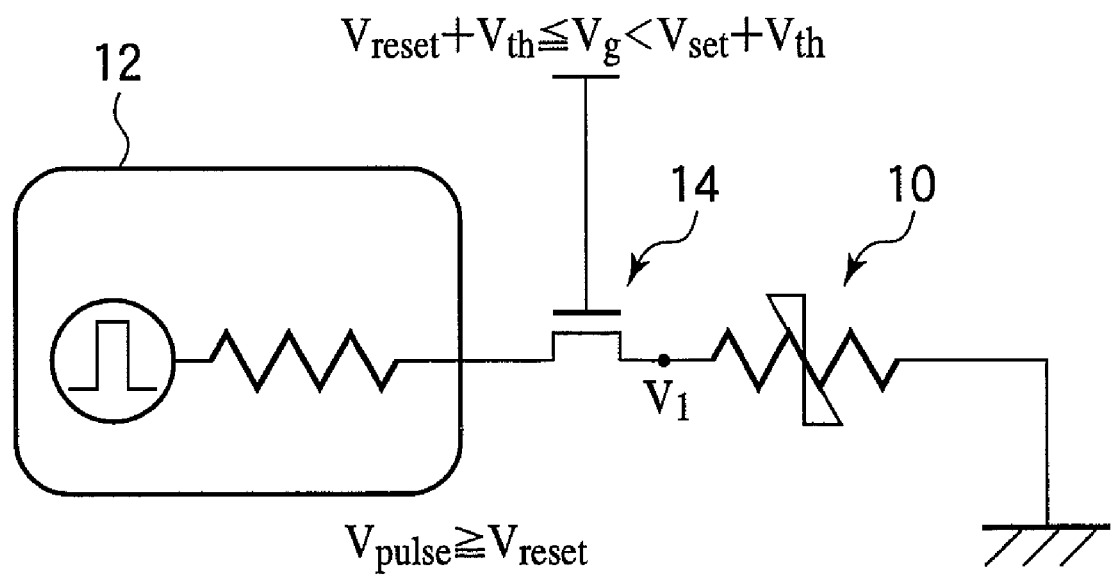
FIG. 4 is a circuit diagram showing the circuit constitution for carrying out the resetting method of the resistance memory element according to a first embodiment of the present invention.

First, the circuit constitution for carrying out the resetting method of the resistance memory element according to the present embodiment will be explained with reference to FIG. 4.

As shown, the pulse generator 12 for applying a pulse voltage is connected to the drain terminal of an NMOS transistor 14. To the source terminal of the NMOS transistor 14, one end of the resistance memory element 10 is connected. The other end of the resistance memory element 10 is connected to the reference potential, e.g., 0 V, which is the ground potential.

The resistance memory element 10 includes a unipolar resistance memory material sandwiched between a pair of electrodes. The electrodes of the pair are both formed of, e.g., Pt. The unipolar resistance memory material is, e.g., $TiO_x$.

Then, the rest method of the resistance memory element according to the present embodiment, which uses the circuit constitution of FIG. 4, will be explained.

It is assumed that the resistance memory element 10 is in the low resistance state.

First, a DC voltage of a voltage value $V_g$ is applied to the gate terminal of the NMOS transistor 14. The voltage value $V_g$ satisfies the relationship of $V_{reset}+V_{th} \leq V_g < V_{set}+V_{th}$ wherein a voltage value necessary to set the resistance memory element 10 is $V_{set}$, a voltage value necessary to reset the resistance memory element 10 is $V_{reset}$, and a threshold voltage value of the NMOS transistor 14 is $V_{th}$. Thus, the value of the gate voltage of the NMOS transistor 14 is set at $V_g$ which satisfies the relationship of $V_{reset}+V_{th} \leq V_g < V_{set}+V_{th}$. Next, with the DC voltage of the voltage value $V_g$ satisfying the relationship of $V_{reset}+V_{th} \leq V_g < V_{set}+V_{th}$ being applied to the gate terminal of the NMOS transistor 14, a pulse voltage of a voltage value $V_{pulse}$ by the pulse generator 12 to the drain terminal of the NMOS transistor 14. Here, the voltage value $V_{pulse}$ is equal to or greater than the voltage value $V_{reset}$ necessary to reset the resistance memory element 10.

To drain terminal of the NMOS transistor 14 having the value of the gate voltage set at $V_g$ satisfying the relationship of $V_{reset}+V_{th} \leq V_g < V_{set}+V_{th}$, the pulse voltage of the voltage value $V_{pulse}$ equal to or greater than $V_{reset}$ is thus applied, whereby the pulse voltage is applied to the resistance memory element 10 connected to the source terminal of the NMOS transistor 14. Thus, the resistance value of the resistance memory element 10 rises, and the resistance memory element 10 is reset from the low resistance state to the high resistance state.

As described above, the resetting method of the resistance memory element according to the present embodiment is characterized mainly in that the pulse voltage of the voltage value $V_{pulse}$ equal to or greater than $V_{reset}$ is applied to the drain terminal of the NMOS transistor 14 having the value of the gate voltage set at the $V_g$ satisfying the relationship of $V_{reset}+V_{th} \leq V_g < V_{set}+V_{th}$, whereby the pulse voltage is applied to the resistance memory element 10 connected to the source terminal of the NMOS transistor 14.

When the pulse voltage of the voltage value $V_{pulse}$ equal to or greater than $V_{reset}$ is applied to the drain terminal of the NMOS transistor 14 by the pulse generator 12, the resistance value of the resistance memory element 10 rises. Accompanying this, the voltage $V_1$ applied to the resistance memory element 10 also rises.

Here, in the resetting method of the resistance memory element according to the present embodiment, the pulse voltage is applied to the resistance memory element 10 via the NMOS transistor 14. Accordingly, the upper limit of the voltage $V_1$ applied to the resistance memory element 10 is determined by a value of the gate voltage of the NMOS transistor 14. That is, because the value of the gate voltage of the NMOS transistor 14 set at $V_g$ satisfying the relationship of $V_{reset}+V_{th} \leq V_g < V_{set}+V_{th}$, the voltage $V_1$ applied to the resistance memory element 10 is equal to or greater than $V_{reset}$ but never becomes equal to or greater than $V_{set}$. Accordingly, when the resistance memory element 10 is reset from the low resistance state to the high resistance state, the resistance memory element 10 which has been changed from the low resistance state to the high resistance state can retain the high resistance state without being changed again to the low resistance state.

The resistance memory element 10 using the resistance memory material of metal oxide takes longer time to be reset than to be set. A period of time in which the resistance memory element 10 changes the resistance state is shorter as the voltage applied to the resistance memory element 10 is larger. Accordingly, the period of time necessary for the resistance memory element 10 to be reset can be shortened by setting the voltage to be applied to the resistance memory element 10 when the resistance memory element 10 is reset to be as large as possible in the range of smaller than $V_{set}$. To this end, when the resistance memory element 10 is reset, the gate voltage $V_g$ of the NMOS transistor 14 may be set to be as large as possible in the range of smaller than $V_{set}+V_{th}$.

Figure 5:
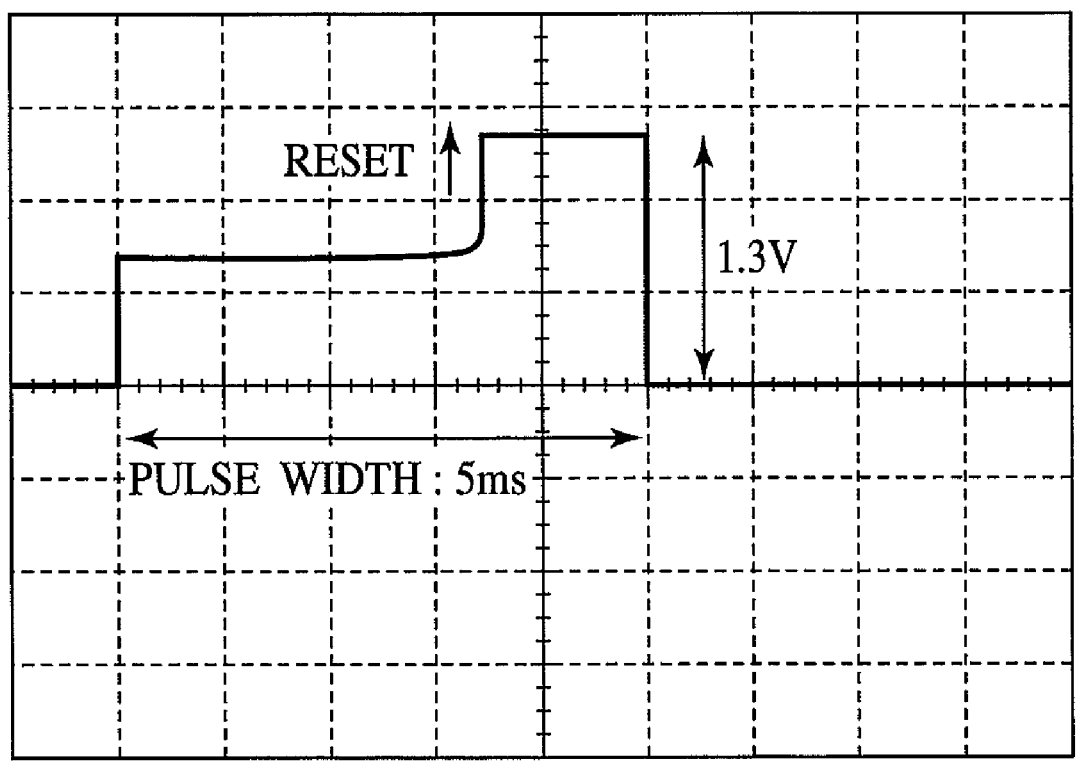
FIG. 5 is a graph of the result of measuring the time variation of the voltage applied to the resistance memory element in the resetting method of the resistance memory element according to the first embodiment of the present invention.

FIG. 5 is a graph showing the result of measuring the time variation of the voltage $V_1$ applied to the resistance memory element in the resetting method of the resistance memory element according to the present embodiment. In the graph, time is taken on the horizontal axis, and the voltage $V_1$ applied to the resistance memory element is taken on the vertical axis. The sample used in the measurement was a 5 μm-diameter resistance memory element including a lower electrode of Pt, a 20 nm-thickness resistance memory material layer of $TiO_x$ and an upper electrode of Pt. This sample had the current-voltage characteristics shown in FIG. 1, an about 1.8 V set voltage and an about 0.7 V reset voltage. The value $V_{th}$ of the threshold voltage of the NMOS transistor was about 1.7 V. The value $V_g$ of the DC voltage applied to the gate terminal of the NMOS transistor was 3 V. The voltage value $V_{pulse}$ of the pulse voltage applied to the drain terminal of the NMOS transistor was 5 V, and the pulse width was 5 ms.

As shown in FIG. 5, the resistance memory element was reset after about 3 ms from the application of the pulse voltage to the drain terminal of the NMOS transistor. Accompanying this, the voltage $V_1$ applied to the resistance memory element rose, and then the voltage of 1.3 V was being applied to the resistance memory element until the application of the pulse voltage was finished. This 1.3 V voltage is smaller than the set voltage of the resistance memory element, and the resistance memory element is never set again. Based on this result, it has been confirmed that according to the present embodiment, the resistance memory element can be surely reset from the low resistance state to the high resistance state. The resistance value of the sample after the voltage change measurement of FIG. 5 was measured, and the resistance value of the high resistance state was measured.

As described above, according to the present embodiment, when the resistance memory element is switched from the low resistance state to the high resistance state, the voltage is applied to the resistance memory element via the transistor having the gate voltage set at the prescribed voltage value, whereby the application of an excessive voltage to the resistance memory element is prevented to thereby prevent the resistance memory element from being changed again to the low resistance state.

A SECOND EMBODIMENT

Figure 6:
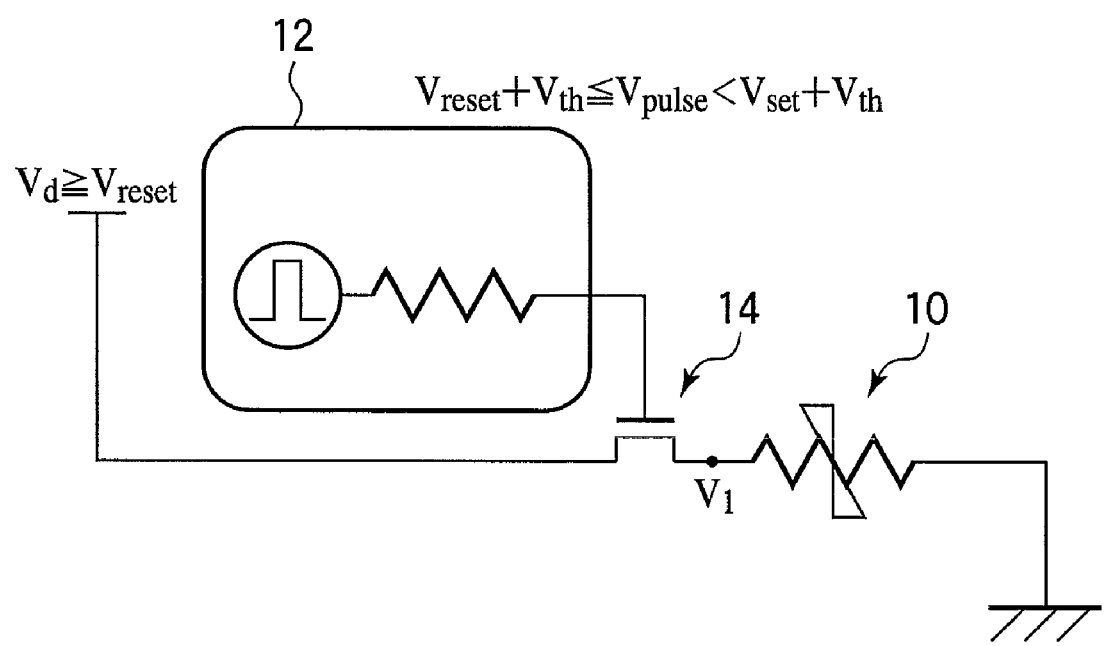
FIG. 6 is a circuit diagram showing the circuit constitution for carrying out the resetting method of the resistance memory element according to a second embodiment of the present invention.

The resetting method of the resistance memory element according to a second embodiment of the present invention will be explained with reference to FIGS. 6 and 7. The same members of the present embodiment as those of the resetting method of the resistance memory element according to the first embodiment are represented by the same reference numbers not to repeat or to simplify their explanation.

First, the circuit constitution for carrying out the resetting method of the resistance memory element according to the present embodiment will be explained with reference to FIG. 6.

As shown, a pulse generator 12 for applying a pulse voltage is connected to the gate terminal of an NMOS transistor 14. To the source terminal of the NMOS transistor 14, one end of the resistance memory element 10 is connected. The other end of the resistance memory element 10 is connected to a reference voltage, e.g., 0 V, which is the ground voltage.

The resistance memory element 10 includes a unipolar resistance memory material sandwiched between a pair of electrodes. The electrodes of the pair are formed of, e.g., Pt. The unipolar resistance memory material is, e.g., $TiO_x$.

Then, the resetting method of the resistance memory element according to the present embodiment using the circuit constitution shown in FIG. 6 will be explained.

It is assumed that the resistance memory element 10 is in the low resistance state.

First, a DC voltage of a voltage value $V_d$ is applied to the drain terminal of the NMOS transistor 14. Here, the voltage value $V_d$ is equal to or greater than a voltage value $V_{reset}$ necessary to reset the resistance memory element 10.

Then, with the DC voltage of the voltage value $V_d$ equal to or greater than $V_{reset}$ being applied to the drain terminal of the NMOS transistor 14, a pulse voltage of a voltage value $V_{pulse}$ is applied to the gate terminal of the NMOS transistor 14 by the pulse generator 12. Here, the voltage value $V_{pulse}$ satisfies the relationship of $V_{reset}+V_{th} \leq V_{pulse} < V_{set}+V_{th}$ wherein a voltage value necessary to set the resistance memory element 10 is $V_{set}$, a voltage value necessary to reset the resistance memory element 10 is $V_{reset}$, and a threshold voltage value of the NMOS transistor 14 is $V_{th}$. Thus, the value of the gate voltage of the NMOS transistor 14 is set at $V_{pulse}$ which satisfies the relationship of $V_{reset}+V_{th} \leq V_{pulse} < V_{set}+V_{th}$ while the pulse voltage is being applied to the gate terminal.

Thus, the pulse voltage is applied to the resistance memory element 10 connected to the source terminal of the NMOS transistor 14 by applying the pulse voltage of the voltage value $V_{pulse}$ satisfying the relationship of $V_{reset}+V_{th} \leq V_{pulse} < V_{set}+V_{th}$ to the gate terminal of the NMOS transistor 14 with the DC voltage of the voltage value $V_d$ equal to or greater than $V_{reset}$ being applied to the drain terminal of the NMOS transistor 14. Thus, the resistance value of the resistance memory element 10 rises, and the resistance memory element 10 is reset from the low resistance state to the high resistance state.

As described above, the resetting method of the resistance memory element according to the present embodiment is characterized mainly in that with the DC voltage of the voltage value $V_d$ equal to or greater than $V_{reset}$ being applied to the drain terminal of the NMOS transistor 14, the pulse voltage of the voltage value $V_{pulse}$ satisfying the relationship of $V_{reset}+V_{th} \leq V_{pulse} < V_{set}+V_{th}$ is applied to the gate terminal of the NMOS transistor 14, whereby the pulse voltage is applied to the resistance memory element 10 connected to the source terminal of the NMOS transistor 14.

When the pulse voltage of the voltage value $V_{pulse}$ satisfying the relationship of $V_{reset}+V_{th} \leq V_{pulse} < V_{set}+V_{th}$ is applied to the gate terminal of the NMOS transistor 14, the resistance value of the resistance memory element 10 rises because the DC voltage of the voltage value $V_d$ equal to or greater than $V_{reset}$ is applied to the drain terminal of the NMOS transistor 14. Accompanying this, the voltage $V_1$ applied to the resistance memory element 10 also rises.

In the resetting method of the resistance memory element according to the present embodiment, the pulse voltage is applied to the resistance memory element 10 via the NMOS transistor 14. Accordingly, the upper limit of the voltage $V_1$ applied to the resistance memory element 10 is determined by a value of the gate voltage of the NMOS transistor 14. That is, the value of the gate voltage of the NMOS transistor 14 is set at the $V_{pulse}$ satisfying the relationship of $V_{reset}+V_{th} \leq V_{pulse} < V_{set}+V_{th}$ while the pulse voltage is being applied to the gate terminal by the pulse generator 12. Accordingly, the voltage $V_1$ applied to the resistance memory element 10 is equal to or greater than $V_{reset}$ and is smaller than $V_{set}$, and never becomes equal to or greater than $V_{set}$. Thus, when the resistance memory element 10 is reset from the low resistance state to the high resistance state, the resistance memory element which has been changed from the low resistance state to the high resistance state can retain the high resistance state without being changed again to the low resistance state.

In the present embodiment as well, in the same way as in the first embodiment, when the resistance memory element 10 is reset, the gate voltage $V_g$ of the NMOS transistor 14 is set to be as large as possible in the range of smaller than $V_{set}+V_{th}$, whereby a voltage which is as large as possible in the range of smaller than $V_{set}$ can be applied to the resistance memory element 10. Thus, the period of time required for the reset can be shortened.

Figure 7:
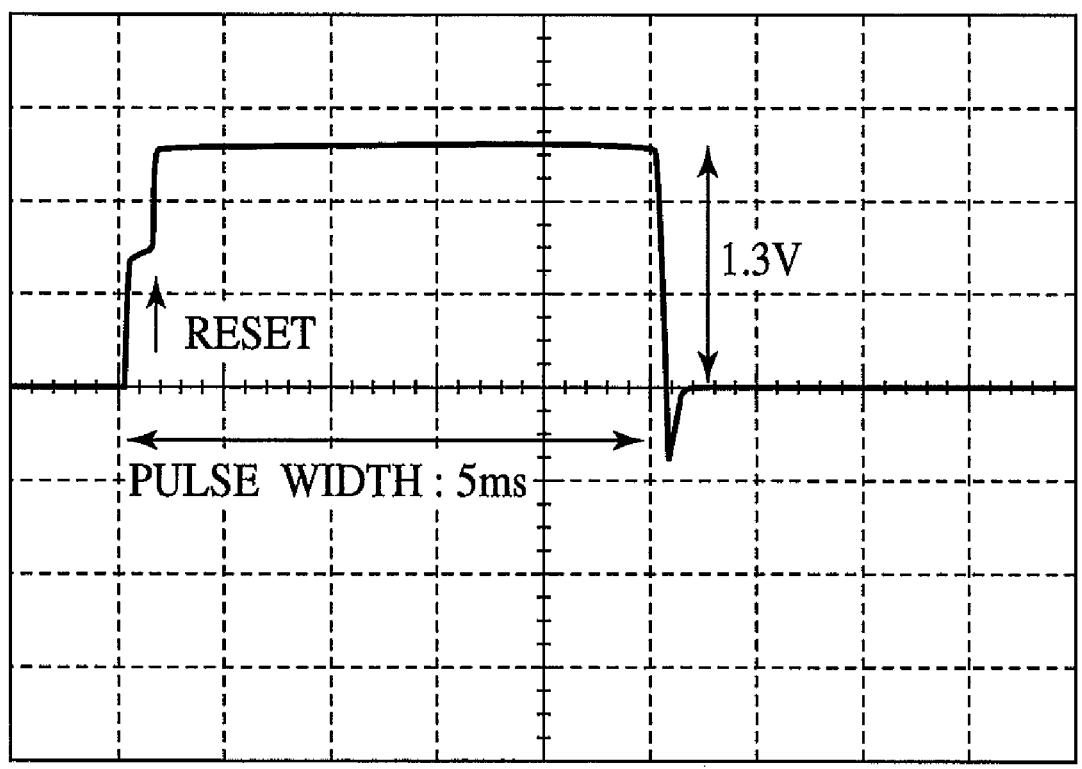
FIG. 7 is a graph of the result of measuring the time variation of the voltage applied to the resistance memory element in the resetting method of the resistance memory element according to the second embodiment of the present invention.

FIG. 7 is a graph showing the result of measuring the time variation of the voltage $V_1$ applied to the resistance memory element in the resetting method of the resistance memory element according to the present embodiment. In the graph, time is taken on the horizontal axis, and the voltage $V_1$ applied to the resistance memory element is taken on the vertical axis. The resistance memory element, which is the sample used in the measurement, and the NMOS transistor were the same as those used in the first embodiment shown in FIG. 5. The value $V_d$ of the DC voltage applied to the drain terminal of the NMOS transistor was 5 V. The voltage value $V_{pulse}$ of the pulse voltage applied to the gate terminal of the NMOS transistor was 3 V, and the pulse width was 5 ms.

As shown in FIG. 7, the resistance memory element was reset about 300 μs later from the application of the pulse voltage to the gate terminal of the NMOS transistor. Accompanying this, the voltage $V_1$ applied to the resistance memory element rose, and then the voltage of 1.3 V was being applied to the resistance memory element until the application of the pulse voltage was finished. This voltage of 1.3 V is smaller than the set voltage of the resistance memory element, and the resistance memory element is never set again. Based on this result, it has been confirmed that according to the present embodiment, the resistance memory element can be surely reset from the low resistance state to the high resistance state. The resistance value of the sample after the voltage change measurement of FIG. 7 was measured, and the resistance value of the high resistance state was measured.

As described above, according to the present embodiment, when the resistance memory element is switched from the low resistance state to the high resistance state, the voltage is applied to the resistance memory element via the transistor having the gate voltage set at the prescribed voltage value, whereby the application of an excessive voltage to the resistance memory element can be prevented to thereby prevent the resistance memory element from being changed again to the low resistance state.

In the present embodiment, it is possible that the voltage value $V_{pulse}$ of the pulse voltage applied to the gate terminal of the NMOS transistor 14 by the pulse generator 12 is set at a value equal to or greater than $V_{set}+V_{th}$ in the initial period of time after the rise of the pulse voltage, i.e., in a prescribed period of time before the resistance memory element 10 is changed from the low resistance state to the high resistance state and then, in the same was as described above, is set at a value satisfying the relationship of $V_{reset}+V_{th} \leq V_{pulse} < V_{set}+V_{th}$ before the resistance memory element 10 is changed from the low resistance state to the high resistance state.

The application of such pulse voltage can make the voltage applied to the resistance memory element 10 sufficiently large before the resistance memory element 10 is changed from the low resistance state to the high resistance state. Specifically, the voltage value $V_d$ of the DC voltage applied to the drain terminal of the NMOS transistor 14 is set at a value equal to or greater than $V_{set}$, whereby the voltage applied to the resistance memory element 10 can be equal to or greater than $V_{set}$. Thus, the current amount flowing to the resistance memory element 10 can be sufficiently ensured, and the period of time necessary to resetting the resistance memory element 10 can be shortened. Hereafter, the voltage applied to the resistance memory element 10 becomes equal to or greater than $V_{reset}$ and smaller than $V_{set}$ before the resistance memory element 10 is changed from the low resistance state to the high resistance state. Thus, in the same way as described above, the resistance memory element 10 can be prevented from being changed from the high resistance state again to the low resistance state.

A THIRD EMBODIMENT

The nonvolatile semiconductor memory device and the method of writing into the nonvolatile semiconductor memory device according to a third embodiment of the present invention will be explained with reference to FIGS. 8 to 12D.

Figure 8:
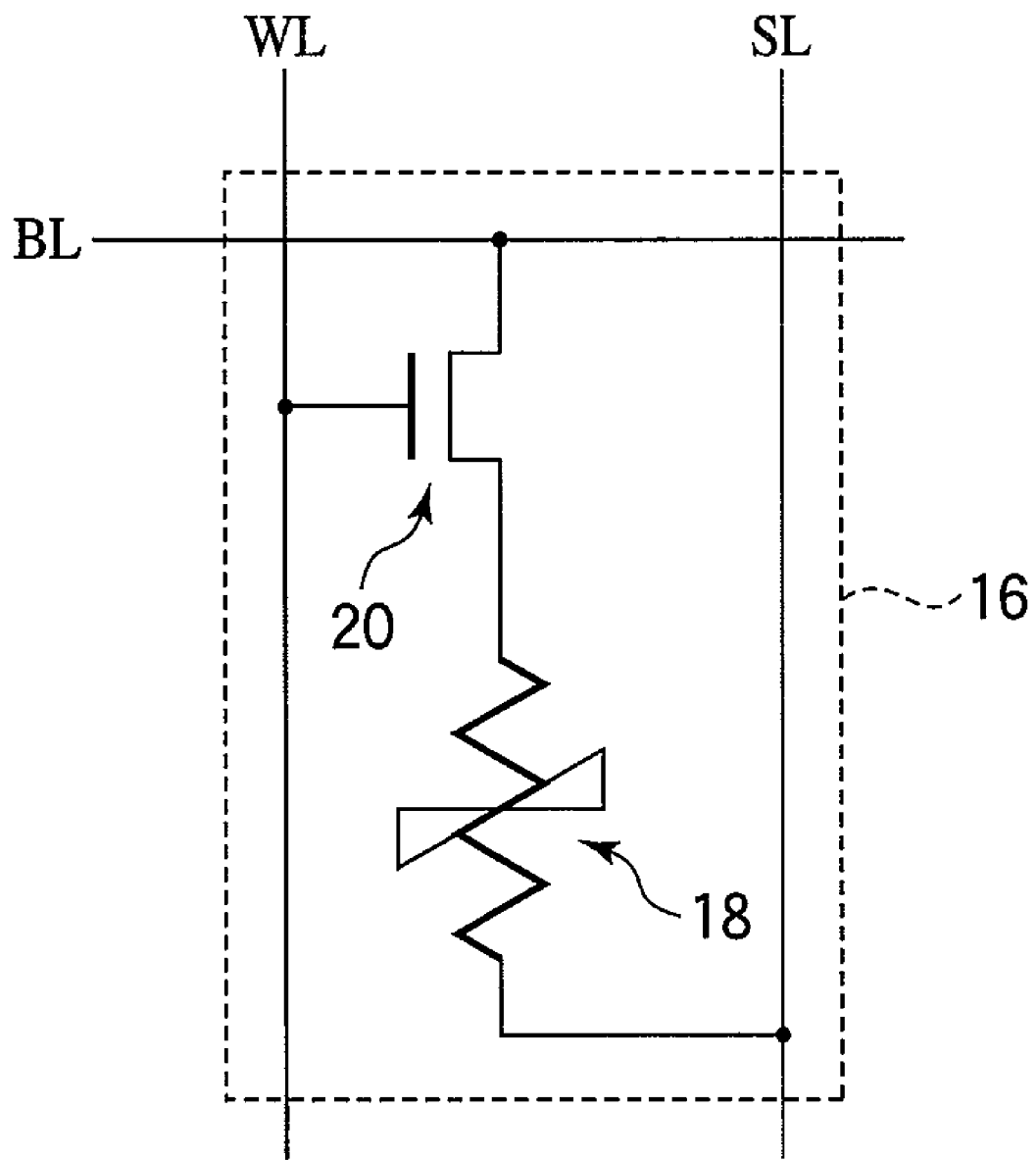
FIGS. 8 and 9 are circuit diagrams showing the structure of the nonvolatile semiconductor memory device according to a third embodiment of the present invention.

The memory cell 16 of the nonvolatile semiconductor memory device according to the present embodiment includes, as shown in FIG. 8, a resistance memory element 18 and a cell select transistor 20. The resistance memory element 18 has one end connected to the drain terminal of the cell select transistor 20 and the other end connected to a source line SL. The cell select transistor 20 has the source terminal connected to a bit line BL and the gate terminal connected to a word line WL. The resistance memory element 18 is formed of a unipolar resistance memory material of, e.g., $TiO_x$ sandwiched between a pair of electrodes. The cell select transistor 20 is a MOS transistor whose threshold voltage is, e.g., 0.3-1 V.

Figure 9:
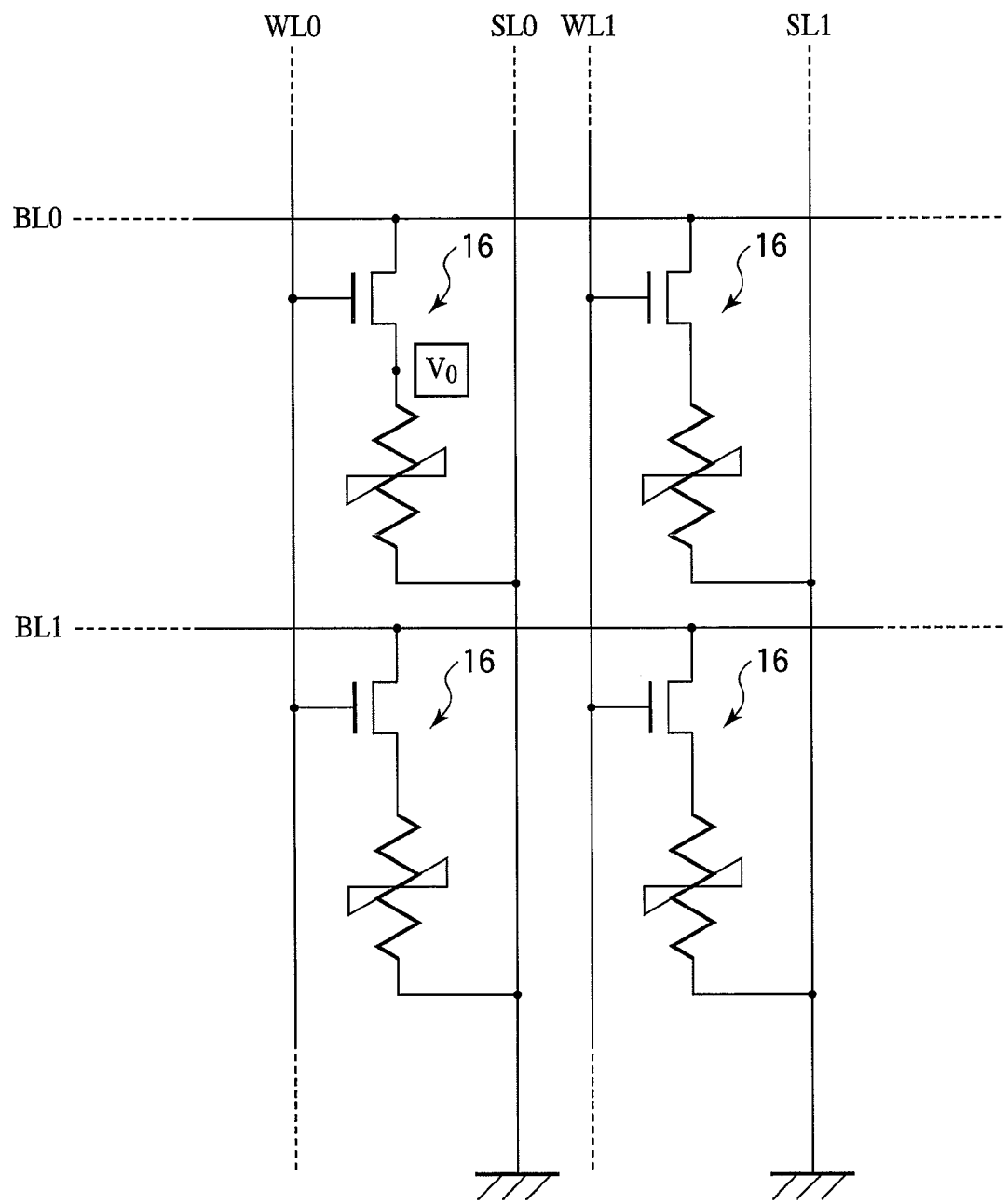

FIG. 9 is a circuit diagram of the memory cell array of the memory cells 16 arranged in a matrix. A plurality of the memory cells 16 are formed adjacent to each other column-wise (vertically in the drawing) and row-wise (transversely in the drawing).

A plurality of word lines WL0, WL1, . . . are arranged column-wise, forming common signal lines for the memory cells 16 arranged column-wise. Source lines SL0, SL1, . . . are arranged column-wise, forming common signal lines for the memory cells 16 arranged column-wise.

A plurality of bit lines BL0, BL1, . . . are arranged row-wise (transversely in the drawing), forming common signal lines for the memory cells 16 arranged row-wise.

Then, the method of writing into the nonvolatile semiconductor memory device according to the present embodiment shown in FIG. 9 will be explained with reference to FIGS. 10A-11D and 11A-11D.

First, the rewriting operation from the high resistance state to the low resistance state, i.e., the setting operation will be explained with reference to FIG. 10A-10D. The memory cell 16 to be rewritten is a memory cell 16 connected to the word line WL0 and the bit line BL0.

Figure 10A:
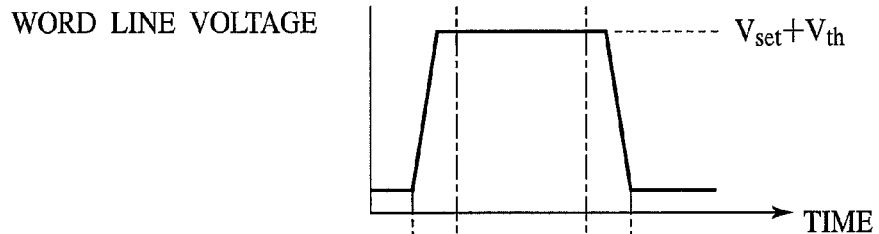
FIGS. 10A-10D and 11A-11D are time charts showing the method of writing into the nonvolatile semiconductor memory device according to the third embodiment of the present invention.

First, a prescribed voltage is applied to the word line WL0 to turn on the cell select transistor 20. At this time, the voltage applied to the word line WL0 is controlled to be $V_{set}+V_{th}$ wherein a set voltage necessary to set the resistance memory element 18 is $V_{set}$, and a threshold voltage of the cell select transistor 20 is $V_{th}$ (FIG. 10A). The gate voltage of the cell select transistor 20 is thus set at $V_{set}+V_{th}$ so that a voltage sufficient to set the resistance memory element 18 can be applied to the resistance memory element 18.

The source line SL0 is connected to a reference potential, e.g., 0 V, which is the ground potential.

Figure 10B:
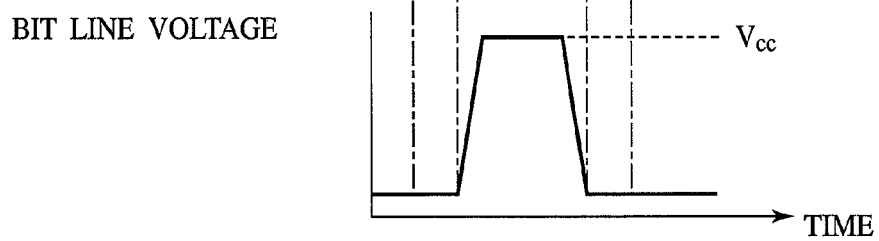

Next, to the bit line BL0, a voltage $V_{cc}$ which is equal to or greater than the voltage $V_{set}$ necessary to set the resistance memory element 18 is applied (FIG. 10B).

Figure 10C:
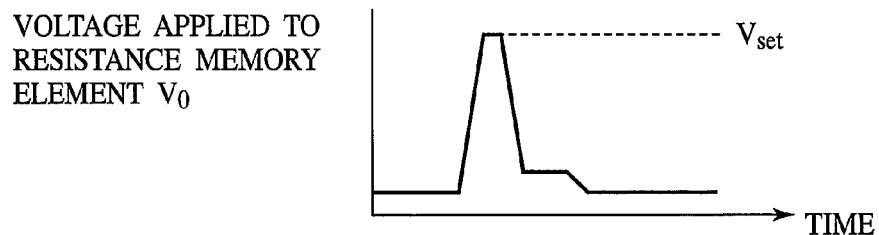
Figure 10D:
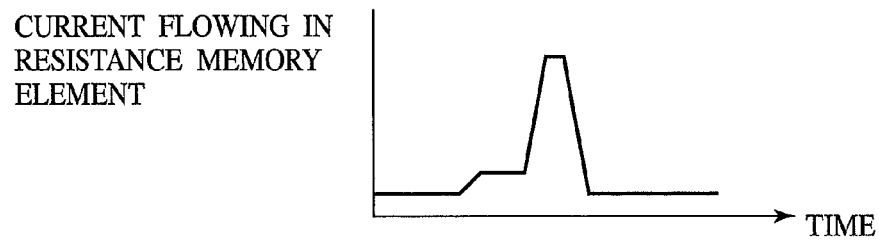

When the voltage is applied to the bit line BL0, a voltage is applied to the resistance memory element 18 from the bit line BL0 via the cell select transistor 20 having the gate voltage set at $V_{set}+V_{th}$. Accordingly, the voltage $V_0$ applied to the resistance memory element 18 first becomes $V_{set}$. This decreases the resistance value of the resistance memory element 18 and the resistance memory element 18 is changed from the high resistance state to the low resistance state. Accompanying the decrease of the resistance value of the resistance memory element 18, the voltage $V_0$ applied to the resistance memory element 18 decreases from $V_{set}$ (FIG. 10C). The current flowing in the resistance memory element 18 increases as the resistance value of the resistance memory element 18 decreases (FIG. 10D).

Next, the voltage applied to the bit line BL0 is returned to zero, and then the voltage applied to the word line WL0 is turned off. Thus, the setting operation is completed.

Next, the rewriting operation from the low resistance state to the high resistance state, i.e., the resetting operation will be explained with reference to FIGS. 11A-11D. The memory cell 16 to be rewritten is a memory cell 16 connected to the word line WL0 and the bit line BL0.

The rewriting operation from the low resistance state to the high resistance state in the present embodiment is made by the resetting method of the resistance memory element according to the first embodiment.

Figure 11A:
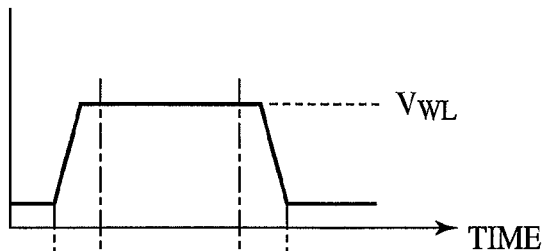

First, a prescribed voltage is applied to the word line WL0 to turn on the cell select transistor 20. At this time, the voltage $V_{WL}$ applied to the word line WL0 has a value satisfying the relationship of $V_{reset}+V_{th} \leq V_{WL} < V_{set}+V_{th}$ wherein the set voltage necessary to set the resistance memory element 18 is $V_{set}$, a reset voltage necessary to reset the resistance memory element 18 is $V_{reset}$, and the threshold voltage of the cell select transistor 20 is $V_{th}$ (FIG. 11A). Thus, the gate voltage $V_g$ of the cell select transistor 20 is set at a value satisfying the relationship of $V_{reset}+V_{th} \leq V_g < V_{set}+V_{th}$ so that a voltage sufficient to reset the resistance memory element 18 can be applied to the resistance memory element 18, and furthermore, the resistance memory element 18 cannot be reset even when the resistance value of the resistance memory element 18 rises.

The source line SL0 is connected to a reference potential, e.g., 0 V, which is the ground potential.

Figure 11B:
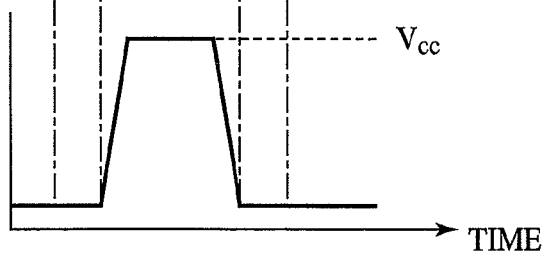

Next, to the bit line BL0, a voltage $V_{cc}$ which is equal to or greater than the voltage $V_{reset}$ necessary to reset the resistance memory element 18 is applied (FIG. 11B).

Figure 11C:
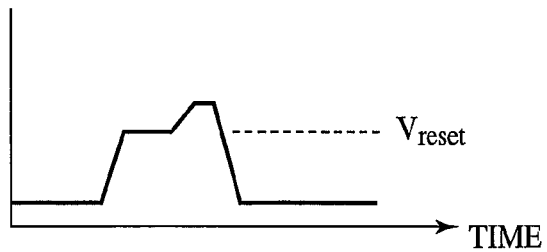

When the voltage equal to or greater than $V_{reset}$ is applied to the bit line BL0, a voltage is applied to the resistance memory element 18 from the bit line BL0 via the cell select transistor 20 having the gate voltage $V_g$ set at a value satisfying the relationship of $V_{reset}+V_{th} \leq V_g < V_{set}+V_{th}$. Accordingly, the voltage $V_0$ applied to the resistance memory element 18 has a value equal to or greater than $V_{reset}$ and smaller than $V_{set}$, and never becomes equal to or greater than $V_{set}$ (FIG. 11C). This increases the resistance value of the resistance memory element 18 and the resistance memory element 18 is changed from the low resistance state to the high resistance state.

Figure 11D:
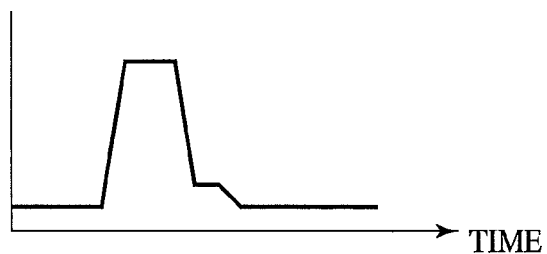

In the above-described resetting process, the instant the resistance value of the resistance memory element 18 rises, the current flowing in the resistance memory element 18 decreases, and the voltage $V_0$ applied to the resistance memory element 18 rises (FIGS. 11C and 11D). However, according to the present embodiment, even when the resistance value of the resistance memory element 18 rises, the voltage $V_0$ applied to the resistance memory element 18 is kept smaller than $V_{set}$, which permits the resistance memory element 18 which has been changed from the low resistance state to the high resistance state to be retained in the high resistance state without being changed again to the low resistance state.

Then, the voltage to be applied to the bit line BL0 is returned to zero, and then the voltage applied to the word line WL0 is turned off. Thus, the resetting operation is completed.

Next, the method of reading from the nonvolatile semiconductor memory device according to the present embodiment shown in FIG. 9 will be explained with reference to FIG. 12A-12D. The memory cell 16 to be read is a memory cell 16 connected to the word line WL0 and the bit line BL0.

Figure 12A:
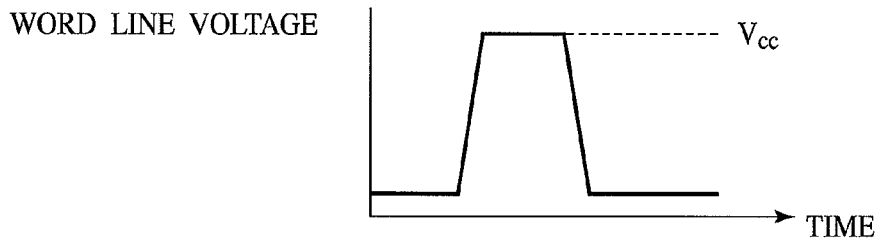
FIGS. 12A-12D are time charts showing the method of reading from the nonvolatile semiconductor memory device according to the third embodiment of the present invention.
Figure 12B:
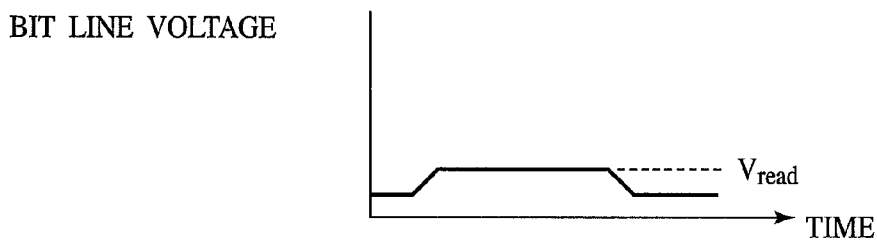
Figure 12C:
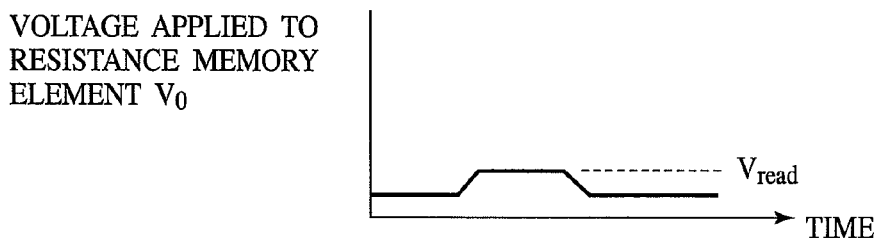

First, a prescribed voltage is applied to the bit line BL0 (FIG. 12B). The voltage $V_{read}$ applied to the bit line BL0 is set so that the resistance memory element 18 in either of the resistance states is not set or reset by the applied voltage.

The source line SL1 is connected to a reference potential, e.g., 0 V, which is the ground potential.

Next, a prescribed voltage is applied to the word line WL0 to turn on the cell select transistor 20 (FIG. 12A).

Figure 12D:
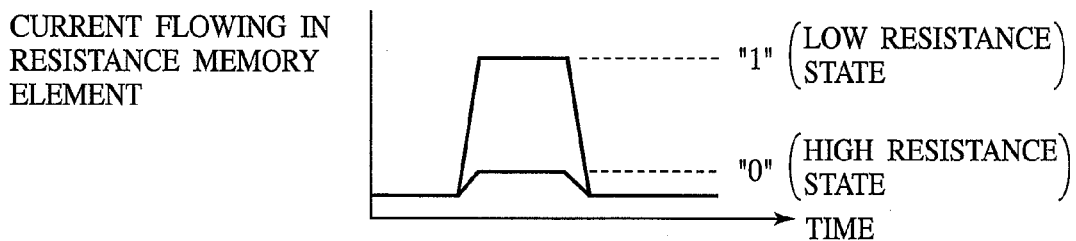

When such voltage is applied to the word line WL0, the voltage $V_{read}$ is applied to the resistance memory element 18 (FIG. 12C), and a current corresponding to the resistance value of the resistance memory element 18 flows in the bit line BL0 (FIG. 12D).

The value of this current flowing in the bit line BL0 is detected, whereby in which state of the high resistance state and the low resistance state the resistance memory element 18 is can be read. That is, whether data held in the memory cell 16 to be read is "0" or "1" can be read (FIG. 12D).

As described above, according to the present embodiment, when the resistance memory element is switched from the low resistance state to the high resistance state, the voltage is applied to the resistance memory element via the transistor having the gate voltage set at the prescribed voltage value, whereby the resistance memory element is prevented from being changed again to the low resistance state due to the application of an excessive voltage to the resistance memory element. Thus, data can be accurately written in the resistance memory element, and the reliability of the nonvolatile semiconductor memory device using the resistance memory element can be improved.

A FOURTH EMBODIMENT

The nonvolatile semiconductor memory device and the method of writing into the nonvolatile semiconductor memory device according to a fourth embodiment of the present invention will be explained with reference to FIGS. 13A to 14D. The same members of the present embodiment as those of the nonvolatile semiconductor memory device and the method of writing into the nonvolatile semiconductor memory device according to the third embodiment are represented by the same reference numbers not to repeat or to simplify their explanation.

The nonvolatile semiconductor memory device according to the present embodiment is the same as the nonvolatile semiconductor memory device according to the third embodiment shown in FIGS. 8 and 9. The method of writing into the nonvolatile semiconductor memory device according to the present embodiment will be explained with reference to FIGS. 13A-13D and 14A-14D.

First, the rewriting operation from the high resistance state to the low resistance state, i.e., the setting operation will be explained with reference to FIG. 13A-13D. The memory cell 16 to be rewritten is a memory cell 16 connected to the word line WL0 and the bit line BL0.

Figure 13A:
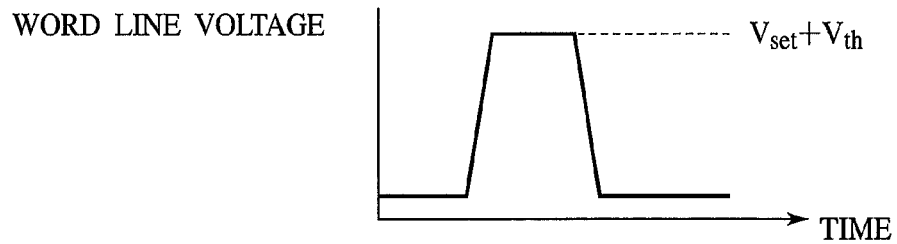
FIGS. 13A-13D and 14A-14D are time charts showing the method of writing into the nonvolatile semiconductor memory device according to a fourth embodiment of the present invention.
Figure 13B:
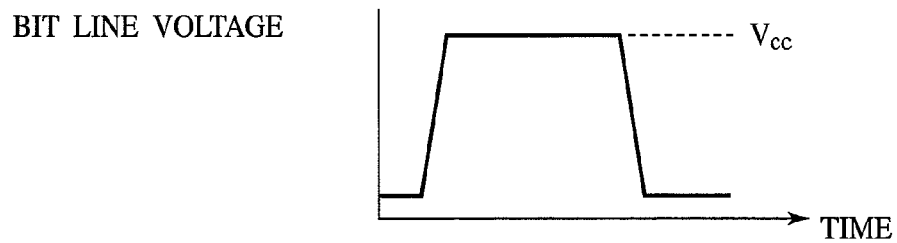

First, to the bit line BL0, a voltage $V_{cc}$ which is equal to or greater than the voltage $V_{set}$ necessary to set the resistance memory element 18 is applied (FIG. 13B).

The source line SL0 is connected to a reference potential, e.g., 0 V, which is the ground potential.

Next, a prescribed voltage is applied to the word line WL0 to turn on the cell select transistor 20. At this time, the voltage applied to the word line WL0 is controlled to be $V_{set}+V_{th}$ wherein a set voltage necessary to set the resistance memory element 18 is $V_{set}$, and a threshold voltage of the cell select transistor 20 is $V_{th}$ (FIG. 13A).

Figure 13C:
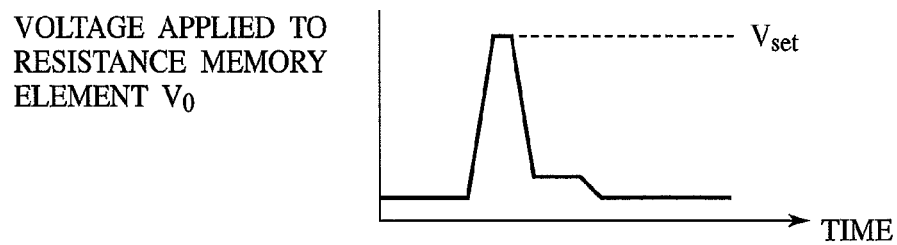
Figure 13D:
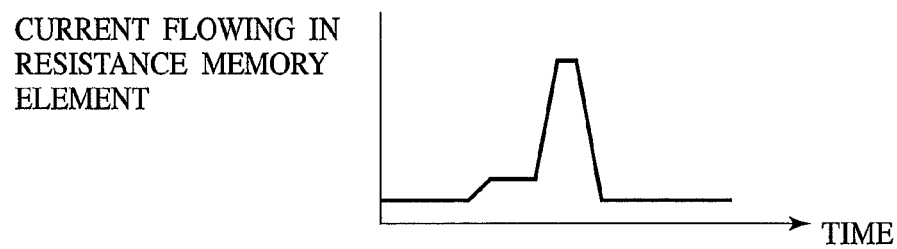

When the cell select transistor 20 is turned on, a voltage is applied from the bit line BL0 to the resistance memory element 18 via the cell select transistor 20 having the gate voltage set at $V_{set}+V_{th}$. Accordingly, the voltage $V_0$ applied to the resistance memory element 18 first becomes $V_{set}$. This decreases the resistance value of the resistance memory element 18 and the resistance memory element 18 is changed from the high resistance state to the low resistance state. Accompanying the decrease of the resistance value of the resistance memory element 18, the voltage $V_0$ applied to the resistance memory element 18 decreases from the $V_{set}$ (FIG. 13C). The current flowing in the resistance memory element 18 increases as the resistance value of the resistance memory element 18 decreases (FIG. 13D).

Next, the voltage applied to the bit line BL0 is returned to zero, and then the voltage applied to the word line WL0 is turned off. Thus, the setting operation is completed.

Next, the rewriting operation from the low resistance state to the high resistance state, i.e., the resetting operation will be explained with reference to FIGS. 14A-14D. The memory cell 16 to be rewritten is a memory cell 16 connected to the word line WL0 and to the bit line BL0.

The rewriting operation from the low resistance state to the high resistance state according to the present embodiment is made by the resetting method of the resistance memory element according to the second embodiment.

Figure 14A:
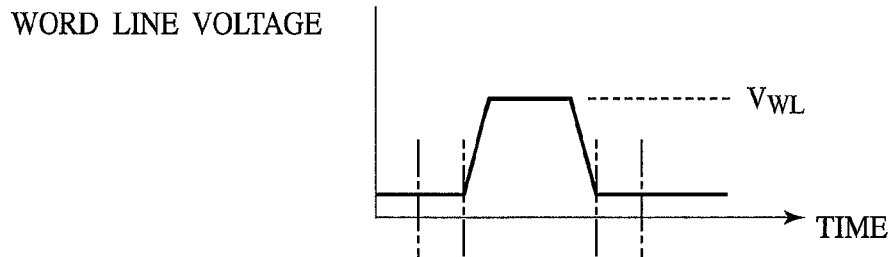
Figure 14B:
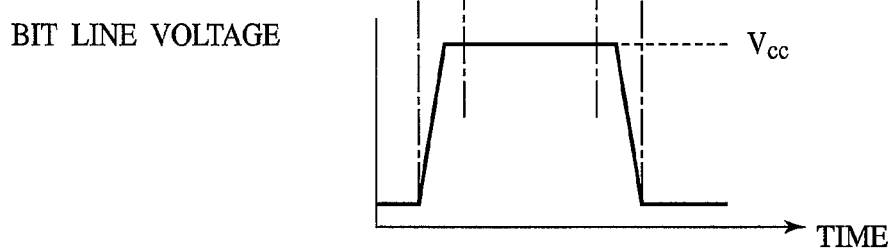

First, to the bit line BL0, a voltage $V_{cc}$ which is equal to or greater than the voltage $V_{reset}$ necessary to reset the resistance memory element 18 is applied (FIG. 14B).

The source line SL0 is connected to a reference potential, e.g., 0 V, which is the ground potential.

Next, a prescribed voltage is applied to the word line WL0 to turn on the cell select transistor 20. At this time, the voltage $V_{WL}$ applied to the word line WL0 has a value satisfying the relationship of $V_{reset}+V_{th} \leq V_{WL} < V_{set}+V_{th}$ wherein the set voltage necessary to set the resistance memory element 18 is $V_{set}$, the reset voltage necessary to reset the resistance memory element 18 is $V_{reset}$, and the threshold voltage of the cell select transistor 20 is $V_{th}$ (FIG. 14A).

Figure 14C:
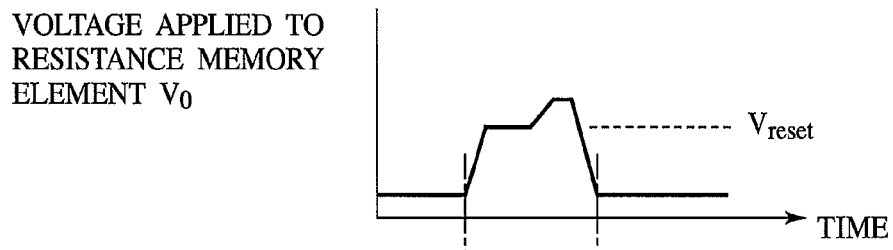

When the cell select transistor 20 is turned on, to the resistance memory element 18, a voltage is applied from the bit line BL0 via the cell select transistor 20 having the gate voltage $V_g$ set at a value satisfying the relationship of $V_{reset}+V_{th} \leq V_g < V_{set}+V_{th}$. Accordingly, the voltage $V_0$ applied to the resistance memory element 18 never has a value equal to or greater than $V_{reset}$ and smaller than $V_{set}$, and never becomes equal to or greater than $V_{set}$ (FIG. 14C). This increases the resistance value of the resistance memory element 18 and the resistance memory element 18 is changed from the low resistance state to the high resistance state.

Figure 14D:
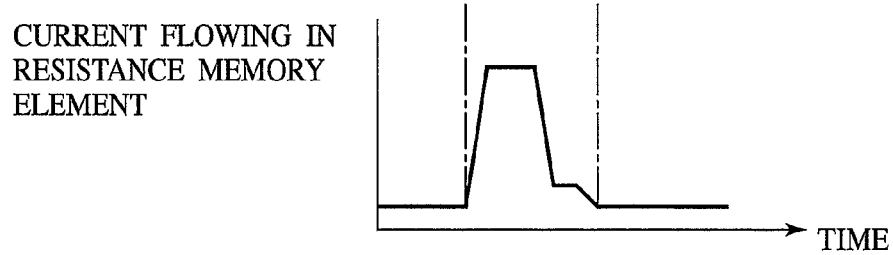

In the above-described resetting process, the instant the resistance value of the resistance memory element 18 rises, the current flowing in the resistance memory element 18 decreases, and the voltage $V_0$ applied to the resistance memory element 18 rises (FIG. 14C and FIG. 14D). However, according to the present embodiment, the voltage $V_0$ applied to the resistance memory element 18 is kept smaller than $V_{set}$, which permits the resistance memory element 18 which has been changed from the low resistance state to the high resistance state to be retained in the high resistance state without being changed again to the low resistance state.

Next, the voltage to be applied to the word line WL0 is returned to zero, and then the voltage applied to the bit line BL0 is turned off. Thus, the resetting operation is completed.

The method of reading from the nonvolatile semiconductor memory device according to the present embodiment is the same as that of the third embodiment.

As described above, according to the present embodiment, when the resistance memory element is switched from the low resistance state to the high resistance state, the voltage is applied to the resistance memory element via the transistor having the gate voltage set at the prescribed voltage value, whereby the resistance memory element can be prevented from being changed again to the low resistance state due to the application of an excessive voltage to the resistance memory element. Thus, data can be accurately written in the resistance memory element, and the reliability of the nonvolatile semiconductor memory device using the resistance memory element can be improved.

(Modifications)

The method of writing into the nonvolatile semiconductor memory device according to a modification of the present embodiment will be explained with reference to FIGS. 15A-15D. FIGS. 15A-15D are time charts showing the method of writing into the nonvolatile semiconductor memory device according to the present modification.

The method of writing into the nonvolatile semiconductor memory device according to the present modification sets the voltage applied to the word line WL0 at a value equal to or greater than $V_{set}+V_{th}$ before the resistance memory element 18 is reset from the voltage application start in above-described rewriting operation from the low resistance state to the high resistance state, whereby the period of time necessary to reset the resistance memory element 18 is shortened.

The rewriting operation from the low resistance state to the high resistance state of the present modification, i.e., the resetting operation will be explained below with reference to FIGS. 15A-15D. The memory cell 16 to be rewritten is a memory cell 16 connected to the word line WL0 and to the bit line BL0.

Figure 15A:
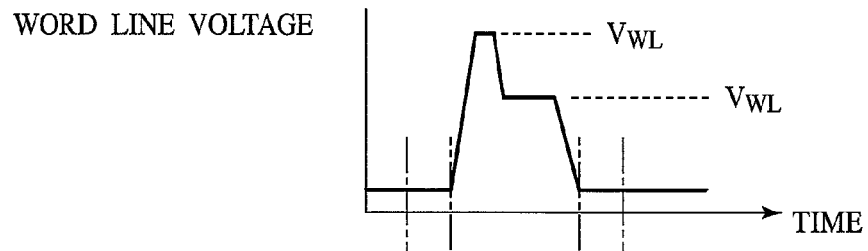
FIGS. 15A-15D are time charts showing the method of writing into the nonvolatile semiconductor memory device according to a modification of the fourth embodiment of the present invention.
Figure 15B:
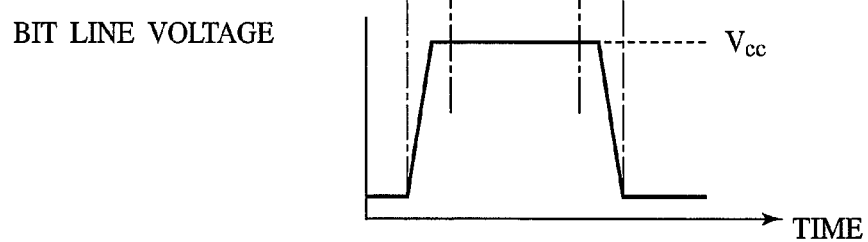

First, to the bit line BL0, a voltage $V_{cc}$ which is equal to or greater than the voltage $V_{set}$ necessary to set the resistance memory element 18 is applied (FIG. 15B).

The source line SL0 is connected to a reference potential, e.g., 0 V, which is the ground potential.

Then, a prescribed voltage is applied to the word line WL0 to turn on the cell select transistor 20. At this time, in the present modification, the voltage $V_{WL}$ applied to the word line WL0 is set at a value equal to or greater than $V_{set}+V_{th}$ in the initial period of time from the start of the voltage application (the initial period of time after the rise of the pulse voltage), i.e., a prescribed period of time before the resistance memory element 18 is changed from the low resistance state to the high resistance state and then is set at a value satisfying the relationship $V_{reset}+V_{th} \leqq V_{WL} < V_{set}+V_{th}$ as described above before the resistance memory element 18 is changed from the low resistance state to the high resistance state (FIG. 15A).

Figure 15C:
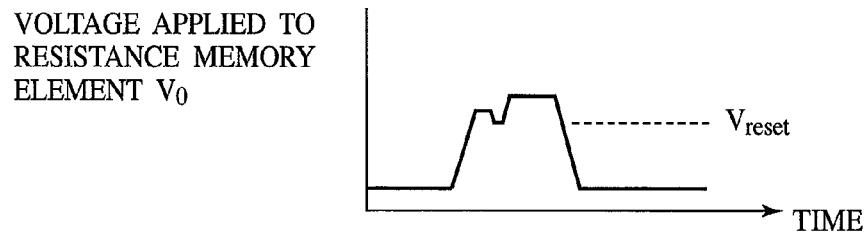
Figure 15D:
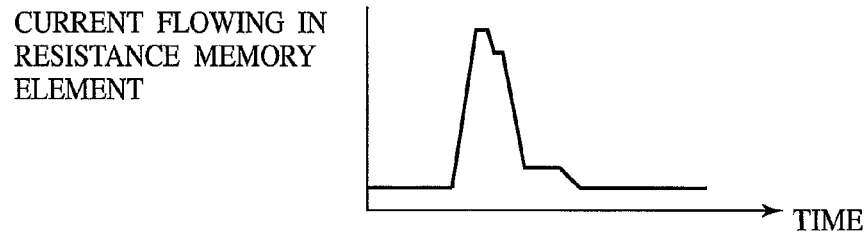

Thus, the voltage applied to the resistance memory element 18 becomes equal to or greater than $V_{set}$ before the resistance memory element 18 is changed from the low resistance state to the high resistance state and then becomes equal to or greater than $V_{reset}$ and smaller than $V_{set}$ before the resistance memory element 18 is changed from the low resistance state to the high resistance state (FIG. 15C).

In the present modification, the voltage applied to the resistance memory element 18 becomes equal to or greater than $V_{set}$ before the resistance memory element 18 is changed from the low resistance state to the high resistance state, whereby the current amount flowing to the resistance memory element 18 can be sufficiently ensured. This allows the period of time necessary for the resistance memory element 18 to be reset to be shortened.

A FIFTH EMBODIMENT

The nonvolatile semiconductor memory device and the method of manufacturing the nonvolatile semiconductor memory device according to a fifth embodiment of the present invention will be explained with reference to FIGS. 16A to 17H.

In the present embodiment, the structure of the nonvolatile semiconductor memory device according to the third embodiment described above and the method for manufacturing the nonvolatile semiconductor memory device will be specifically explained.

First, the structure of the nonvolatile semiconductor memory device according to the present embodiment will be explained with reference to FIGS. 16A and 16B.

Figure 16A:
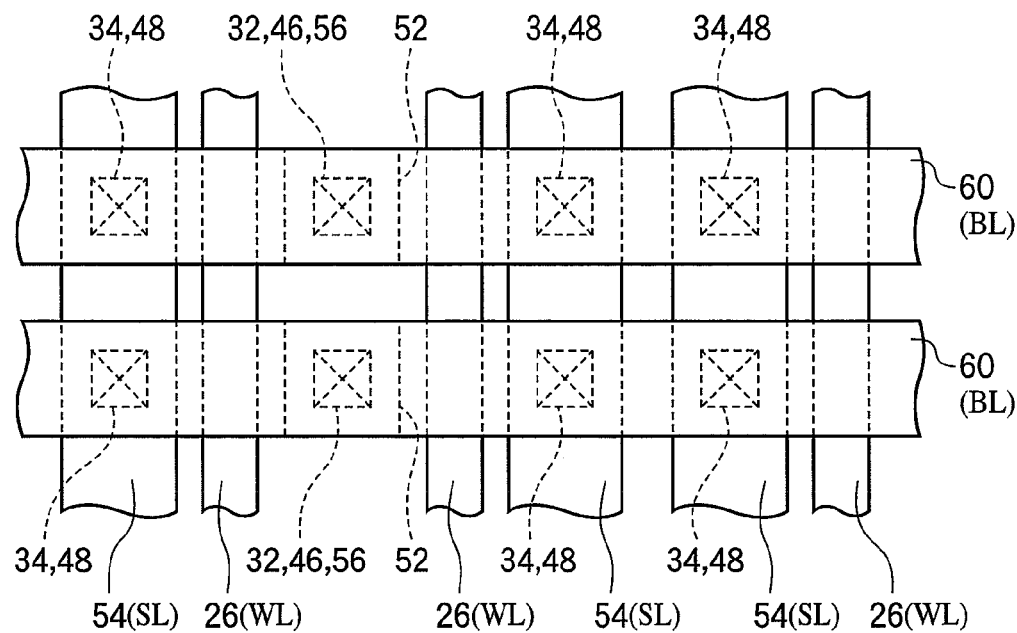
FIGS. 16A and 16B are schematic views showing the structure of the nonvolatile semiconductor memory device according to a fifth embodiment of the present invention.
Figure 16B:
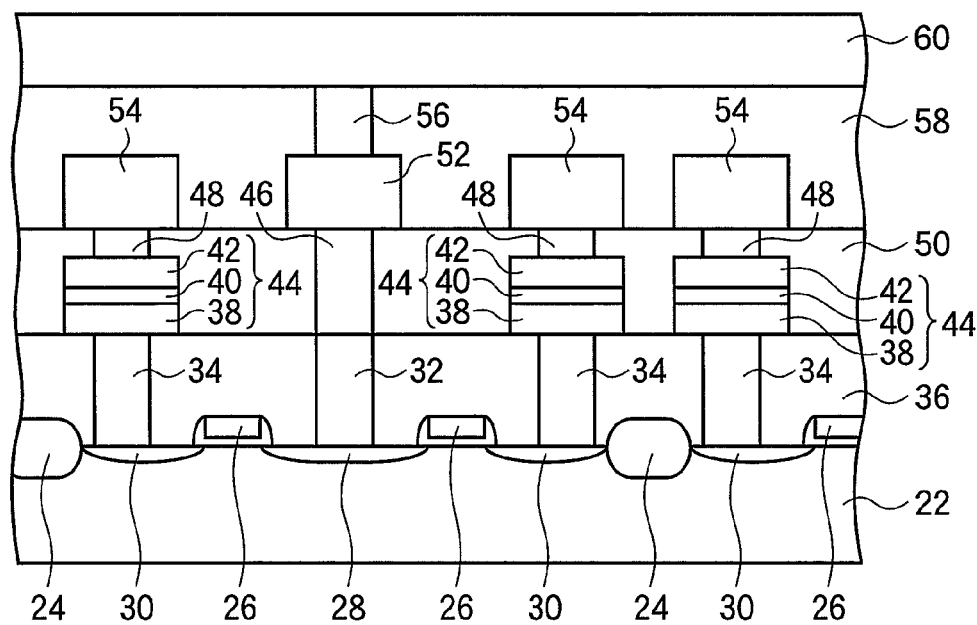

As shown in FIG. 16B, a device isolation film 24 for defining device regions is formed in a silicon substrate 22. In the device regions of the silicon substrate 22, cell select transistors each including a gate electrode 26 and source/drain regions 28, 30 are formed.

As shown in FIG. 16A, the gate electrodes 26 function also as the word lines WL commonly connecting the gate electrodes 26 of the selective transistors adjacent column-wise (vertically in the drawing).

Over the silicon substrate 22 with the cell select transistors formed on, an inter-layer insulating film 36 with contact plugs 32 electrically connected to the source/drain regions 28 and contact plugs 34 electrically connected to the source/drain regions 30 buried in is formed.

Over the inter-layer insulating film 36 with the contact plugs 32, 34 buried in, the resistance memory elements 44 electrically connected to the source/drain regions 30 via the contact plugs 34 are formed.

The resistance memory elements 44 each includes a lower electrode 38 electrically connected to the contact plug 34, a resistance memory material layer 40 formed on the lower electrode 38, and an upper electrode 42 formed on the resistance memory material layer 40.

Over the inter-layer insulating film 36 with the resistance memory elements 44 formed over, an inter-layer insulating film 50 with contact plugs 46 electrically connected to the contact plugs 32, and contact plugs 48 electrically connected to the upper electrodes 42 of the resistance memory elements 44 buried in is formed.

Over the inter-layer insulating film 50 with the contact plugs 46, 48 buried in, relay interconnections 52 electrically connected to the contact plugs 46, and source lines 54 electrically connected to the upper electrodes 42 of the resistance memory elements 44 via the contact plugs 48 are formed.

Over the inter-layer insulating film 50 with the relay interconnections 52 and the source lines 54 formed over, an inter-layer insulating film 58 with contact plugs 56 electrically connected to the relay interconnections 52 buried in is formed.

Over the inter-layer insulating film 58, the bit lines 60 are formed, electrically connected to the source/drain regions 28 via the contact plugs 56, the relay interconnections 52, the contact plugs 46 and the contact plugs 32 buried in the inter-layer insulating film 58, 50, 36.

Thus, the nonvolatile semiconductor memory device according to the third embodiment shown in FIG. 9 is constituted.

Next, the method of manufacturing the nonvolatile semiconductor memory device according to the present embodiment will be explained with reference to FIGS. 17A to 17H.

First, the device isolation film 24 for defining the device regions is formed in the silicon substrate 22.

Figure 17A:
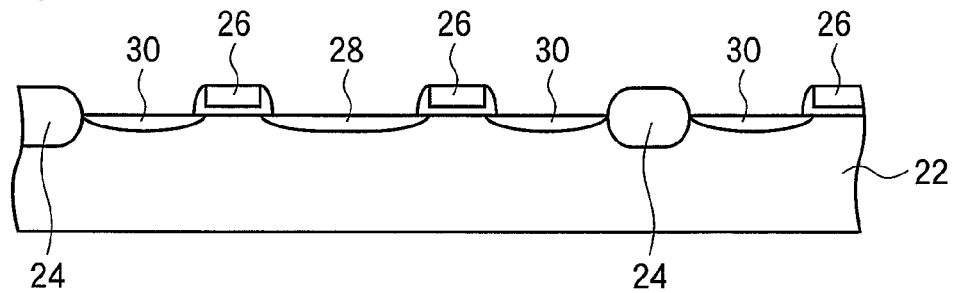
FIGS. 17A to 17H are sectional views showing the method of manufacturing the nonvolatile semiconductor memory device according to the fifth embodiment of the present invention.

Then, in the device regions of the silicon substrate 22, the cell select transistors each including the gate electrode 26 and the source/drain regions 28, 30 are formed in the same way as in the method of manufacturing the usual MOS transistor (FIG. 17A).

Next, over the silicon substrate 22 with the cell select transistors formed on, a silicon oxide film is deposited by, e.g., CVD method to form the inter-layer insulating film 36 of the silicon oxide film.

Next, by lithography and dry etching, the contact holes are formed in the inter-layer insulating film 36 down to the source/drain regions 28, 30.

Figure 17B:
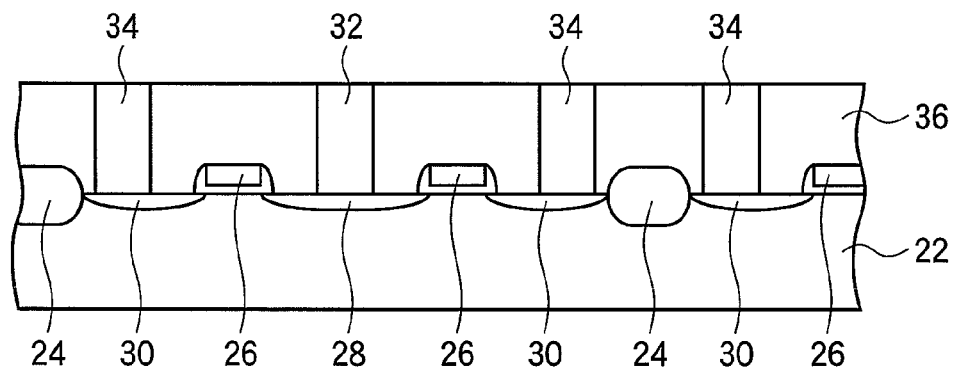

Then, a barrier metal and a tungsten film are deposited by, e.g., CVD method, and these conduction films are etched back to form in the inter-layer insulating film 36 the contact plugs 32, 34 electrically connected to the source/drain regions 28, 30 (FIG. 17B).

Figure 17C:
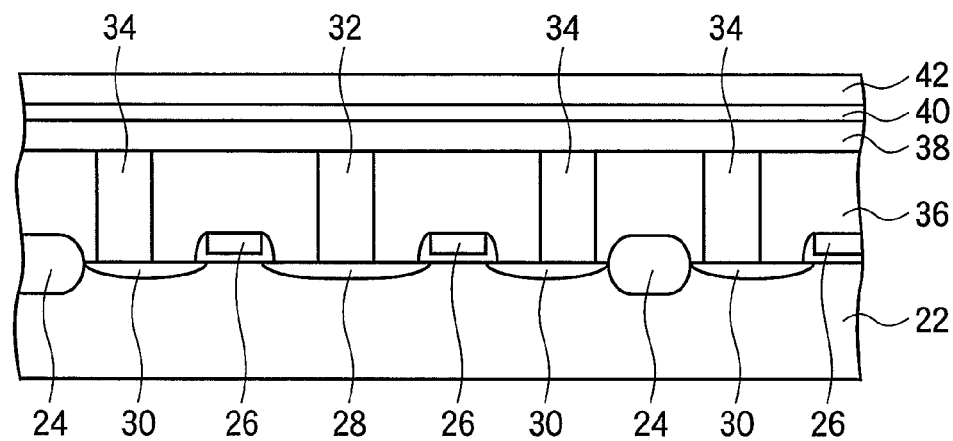

Next, over the inter-layer insulating film 36 with the contact plugs 32, 34 buried in, a Pt film 38, a $TiO_x$ film 40 and a Pt film 42 are sequentially formed (FIG. 17C).

Figure 17D:
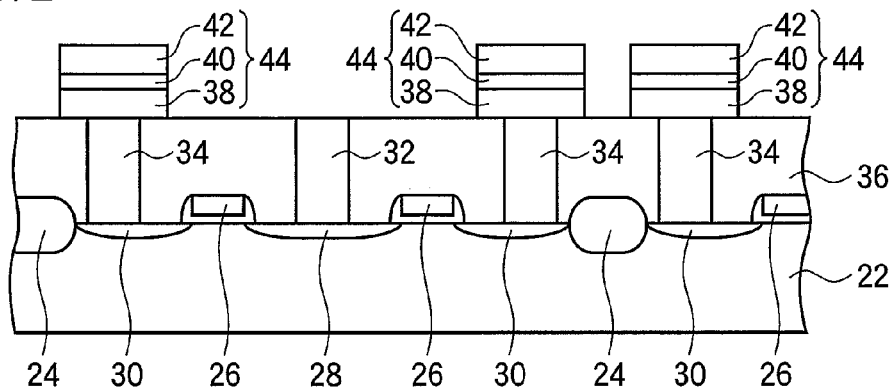

Then, by lithography and dry etching, the Pt film 38, the $TiO_x$ film 40 and the Pt film 42 are patterned to form the resistance memory elements 44 each including the lower electrode 38 of Pt, the resistance memory material layer 40 of $TiO_x$ and the upper electrode 42 of Pt (FIG. 17D).

Next, over the inter-layer insulating film 36 with the resistance memory elements 44 formed over, a silicon oxide film is deposited by, e.g., CVD method to form the inter-layer insulating film 50 of the silicon oxide film.

Then, by lithography and dry etching, the contact holes down to the contact plugs 32 and the contact holes down to the upper electrodes 42 of the resistance memory elements 44 are formed in the inter-layer insulating film 50.

Figure 17E:
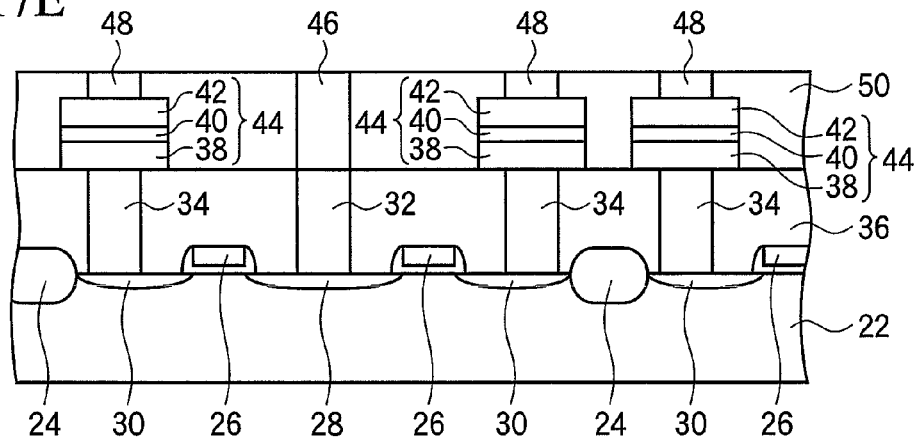

Next, a barrier metal and a tungsten film are deposited by, e.g., CVD method, and these conduction films are etched back to form in the inter-layer insulating film 50 the contact plugs 46 electrically connected to the contact plugs 32 and the contact plugs 48 electrically connected to the upper electrodes 42 of the resistance memory elements 44 (FIG. 17E).

Figure 17F:
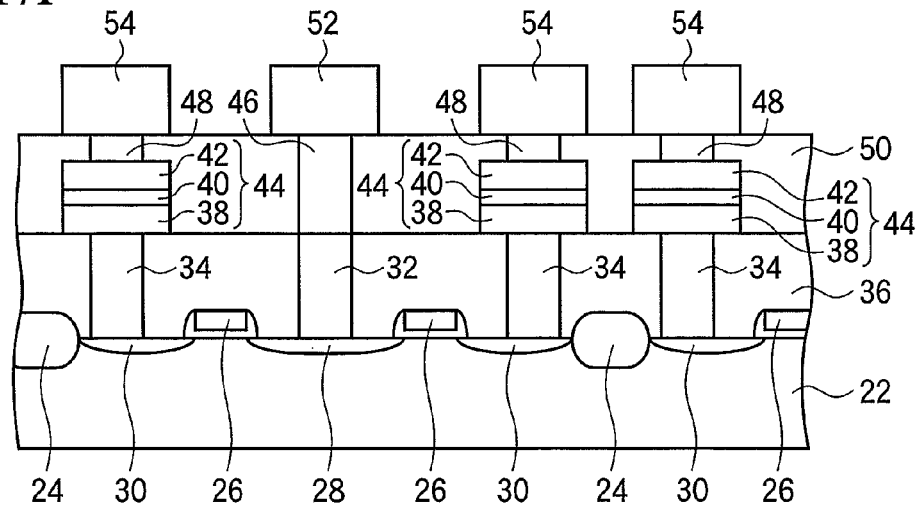

Then, a conduction film is deposited over the inter-layer insulating film 50 with the contact plugs 46, 48 buried in, and this conduction film is patterned by lithography and dry etching to form the relay interconnections 52 electrically connected to the contact plugs 46 and the source lines 54 electrically connected to the upper electrodes 42 of the resistance memory elements via the contact plugs 48 (FIG. 17F).

Next, over the inter-layer insulating film 50 with the relay interconnections 52 and the source lines 54 formed over, a silicon oxide film is deposited by, e.g., CVD method to form the inter-layer insulating film 58 of the silicon oxide film.

Then, by lithography and dry etching, the contact holes are formed in the inter-layer insulating film 58 down to the relay interconnections 52.

Figure 17G:
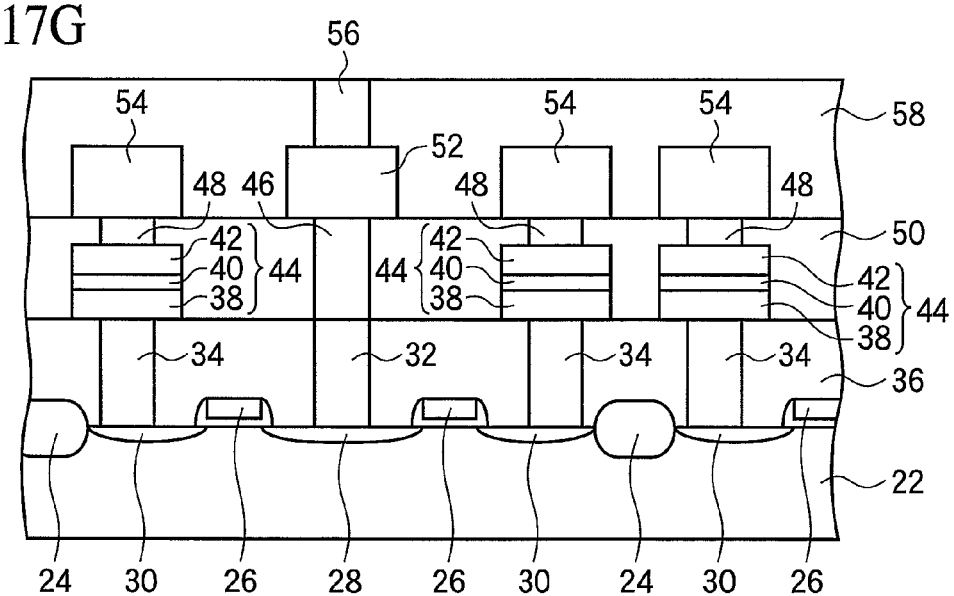

Next, a barrier metal and a tungsten film are deposited by, e.g., CVD method, and these conduction films are etched back to form in the inter-layer insulating film 58 the contact plugs 56 electrically connected to the relay interconnections 52 (FIG. 17G).

Figure 17H:
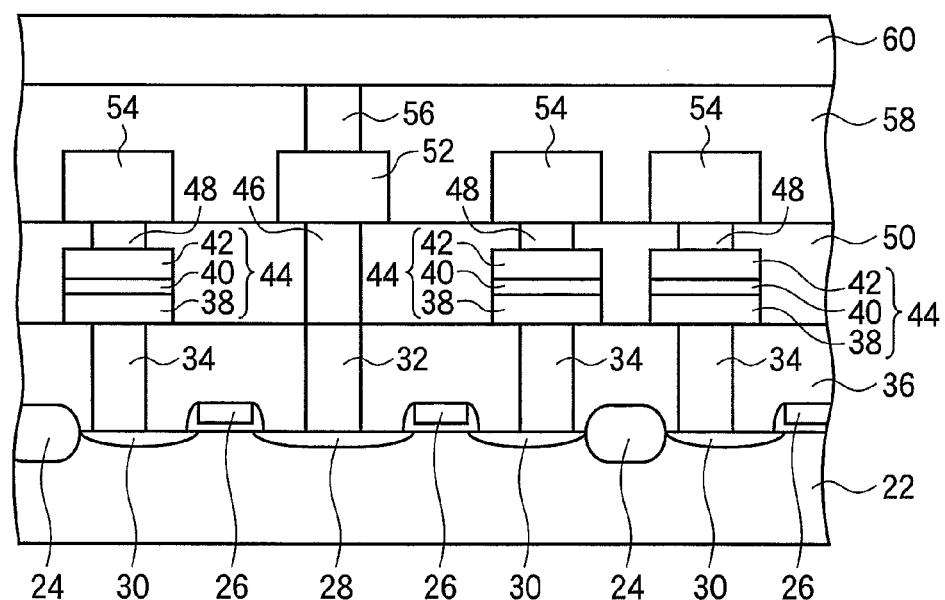

Then, a conduction film is deposited over the inter-layer insulating film 58 with the contact plugs 56 buried in, and the conduction film is patterned by photolithography and dry etching to form the bit lines 60 electrically connected to the source/drain regions 28 via the contact plugs 56, the relay interconnections 52, the contact plugs 46 and the contact plugs 32 (FIG. 17H).

Then, upper interconnection layers are further formed as required, and the nonvolatile semiconductor memory device is completed.

MODIFIED EMBODIMENTS

The present invention is not limited to the above-described embodiments and can cover other various modifications.

For example, in the above-described embodiments, the resistance memory material of the resistance memory elements is $TiO_x$ but is not limited to $TiO_x$. For example, $NiO_x$, etc. are applicable as the resistance memory material.

In the above-described embodiments, the electrodes of the resistance memory elements are formed of Pt, but the constituent material of the electrodes is not limited to Pt.

In the third and the fourth embodiments, a voltage is applied to the resistance memory element via the cell select transistor to thereby make a voltage applied to the resistance memory elements smaller than the set voltage. However, the nonvolatile semiconductor memory device may include, in addition to the cell select transistors, transistors for making a voltage to be applied to the resistance memory elements smaller than the set voltage.

What is claimed is:

1. A semiconductor memory device comprising:
   a resistance memory element which memorizes a high resistance state and a low resistance state and switches between the high resistance state and the low resistance by a voltage application;
   a transistor having one end connected to one end of the resistance memory element; and wherein
   when a voltage is applied to the resistance memory element via the transistor to switch the resistance memory element from the low resistance state to the high resistance state, a gate voltage of the transistor is set at a value which is equal to or greater than a total of a reset voltage necessary to reset the resistance memory element and a threshold voltage of the transistor and is smaller than a total of a set voltage necessary to set the resistance memory element and the threshold voltage, to thereby set the voltage applied to the resistance memory element at a value which is equal to or greater than the reset voltage and is smaller than the set voltage.

2. The semiconductor memory device according to claim 1, further comprising:
   a pulse generator connected to the other end of the transistor.

3. The semiconductor memory device according to claim 2, wherein
   a pulse voltage equal to or greater than the reset voltage is applied to the other end of the transistor, with a voltage which is equal to or greater than the total of the reset voltage and the threshold voltage and is smaller than the total of the set voltage and the threshold voltage being applied to a gate of the transistor.

4. The semiconductor memory device according to claim 1, further comprising:
   a pulse generator connected to a gate of the transistor.

5. The semiconductor memory device according to claim 4, wherein
   a pulse voltage which is equal to or greater than the total of the reset voltage and the threshold voltage and is smaller than the total of the set voltage and the threshold voltage is applied to the gate of the transistor, with a voltage equal to or greater than the reset voltage being applied to the other end of the transistor.

6. The semiconductor memory device according to claim 5, wherein
   the pulse voltage is set at equal to or greater than the total of the set voltage and the threshold voltage in an initial period of time after a rise of the pulse voltage.

7. The semiconductor memory device according to claim 1, wherein
said one end of the transistor is a source and
the other end of the transistor is a drain.

8. The semiconductor memory device according to claim 1, wherein
the transistor is an NMOS transistor.

9. The semiconductor memory device according to claim 1, wherein
the resistance memory element comprises a resistance memory material and electrodes with the resistance memory material sandwiched therebetween.

10. The semiconductor memory device according to claim 1, further comprising:
a plurality of memory cells arranged in a matrix and each including the transistor and the resistance memory element.

11. The semiconductor memory device according to claim 10, further comprising:
a plurality of first signal lines arranged in parallel with each other in a first direction and each connected to gates of the transistors of the memory cells arranged in the first direction; and
a plurality of second signal lines arranged in parallel with each other in a second direction crossing the first direction and each connected to the other ends of the transistors of the memory cells arranged in the second direction.

12. The semiconductor memory device according to claim 11, wherein
a voltage which is equal to or greater than the total of the reset voltage and the threshold voltage and is smaller than the total of the set voltage and the threshold voltage is applied to the first signal line connected to a memory cell to be rewritten of said plurality of the memory cells, whose resistance memory element is to be rewritten from the low resistance state to the high resistance state, and
a pulse voltage equal to or greater than the reset voltage is applied to the second signal line connected to the memory cell to be rewritten, with the voltage which is equal to or greater than the total of the reset voltage and the threshold voltage and is smaller than the total of the set voltage and the threshold voltage being applied to the first signal line connected to the memory cell to be rewritten, to thereby rewrite the resistance memory element of the memory cell to be rewritten from the low resistance state to the high resistance state.

13. The semiconductor memory device according to claim 11, wherein
a voltage equal to or greater than the reset voltage is applied to the second signal line connected to a memory cell to be rewritten of said plurality of the memory cells, whose resistance memory element is to be rewritten from the low resistance state to the high resistance state, and
a pulse voltage which is equal to or greater than the total of the reset voltage and the threshold voltage and is smaller than the total of the set voltage and the threshold voltage is applied to the first signal line connected to the memory cell to be rewritten, with the voltage equal to or greater than the reset voltage being applied to the second signal line connected to the memory cell to be rewritten, to thereby rewrite the resistance memory element of the memory cell to be rewritten from the low resistance state to the high resistance state.

14. The semiconductor memory device according to claim 13, wherein
the pulse voltage is set at equal to or greater than the total of the set voltage and the threshold voltage in an initial period of time after a rise of the pulse voltage.

15. A method of writing into a semiconductor memory device comprising a resistance memory element which memorizes a high resistance state and a low resistance state and switches between the high resistance state and the low resistance state by a voltage application, the method comprising:
providing a transistor having one end connected to one end of the resistance memory element; and
when applying a voltage to the resistance memory element via the transistor to switch the resistance memory element from the low resistance state to the high resistance state, setting a gate voltage of the transistor at a value which is equal to or greater than a total of a reset voltage necessary to reset the resistance memory element and a threshold voltage of the transistor and is smaller than a total of a set voltage necessary to set the resistance memory element and the threshold voltage, to thereby set the voltage applied to the resistance memory element at a value which is equal to or greater than the reset voltage and is smaller than the set voltage.

16. The method of writing into a semiconductor memory device according to claim 15, wherein
a pulse voltage equal to or greater than the reset voltage is applied to the other end of the transistor, with a voltage which is equal to or greater than the total of the reset voltage and the threshold voltage and is smaller than the total of the set voltage and the threshold voltage being applied to a gate terminal of the transistor.

17. The method of writing into a semiconductor memory device according to claim 15, wherein
a pulse voltage which is equal to or greater than the total of the reset voltage and the threshold voltage and is smaller than the total of the set voltage and the threshold voltage is applied to a gate terminal of the transistor, with a voltage equal to or greater than the reset voltage being applied to the other end of the transistor.

18. The method of writing into a semiconductor memory device according to claim 17, wherein
the pulse voltage is set at equal to or greater than the total of the set voltage and the threshold voltage in an initial period of time after a rise of the pulse voltage.

19. A semiconductor memory device comprising:
a plurality of memory cells arranged in a matrix and each including a resistance memory element which memorizes a high resistance state and a low resistance state and switches between the high resistance state and the low resistance state by a voltage application, and a selective transistor having one end connected to one end of the resistance memory element;
a plurality of first signal lines arranged in parallel with each other in a first direction and each connected to gate electrodes of the selective transistors of the memory cells arranged in the first direction; and
a plurality of second signal lines arranged in parallel with each other in a second direction crossing the first direction and each connected to the other ends of the selective transistors of the memory cells arranged in the second direction, wherein
a voltage which is equal to or greater than a total of a reset voltage necessary to reset the resistance memory element and a threshold voltage of the selective transistor and is smaller than a total of a set voltage necessary to set the resistance memory element and the threshold voltage is applied to the first signal line connected to a memory cell to be rewritten of said plurality of the memory cells, whose resistance memory element is to be rewritten from the low resistance state to the high resistance state, and a pulse voltage equal to or greater than the reset voltage is applied to the second signal line connected to the memory cell to be rewritten, with the voltage which is equal to or greater than the total of the reset voltage and the threshold voltage and is smaller than the total of the set voltage and the threshold voltage being applied to the first signal line connected to the memory cell to be rewritten, to thereby rewrite the resistance memory element of the memory cell to be rewritten from the low resistance state to the high resistance state.

20. A semiconductor memory device comprising:

a plurality of memory cells arranged in a matrix and each including a resistance memory element which memorizes a high resistance state and a low resistance state and switches between the high resistance state and the low resistance state by a voltage application, and a selective transistor having one end connected to one end of the resistance memory element;

a plurality of first signal lines arranged in parallel with each other in a first direction and each connected to gate electrodes of the selective transistors of the memory cells arranged in the first direction; and a plurality of second signal lines arranged in parallel with each other in a second direction crossing the first direction and each connected to the other ends of the selective transistors of the memory cells arranged in the second direction, wherein a voltage equal to or greater than a reset voltage necessary to reset the resistance memory element is applied to the second signal line connected to a memory cell to be rewritten of said plurality of the memory cells, whose resistance memory element is to be rewritten from the low resistance state to the high resistance state, and a pulse voltage which is equal to or greater than a total of the reset voltage and a threshold voltage of the selective transistor and is smaller than a total of a set voltage necessary to set the resistance memory element and the threshold voltage is applied to the first signal line connected to the memory cell to be rewritten, with the voltage equal to or greater than the reset voltage being applied to the second signal line connected to the memory cell to be rewritten, to thereby rewrite the resistance memory element of the memory cell to be rewritten from the low resistance state to the high resistance state.

* * * * *